(12) United States Patent
Ku et al.

(10) Patent No.: US 8,970,454 B2
(45) Date of Patent: Mar. 3, 2015

(54) LEVEL SHIFTER, SYSTEM-ON-CHIP INCLUDING THE SAME, AND MULTIMEDIA DEVICE INCLUDING THE SAME

(75) Inventors: Jachun Ku, Seoul (KR); Kyoungmook Lim, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 609 days.

(21) Appl. No.: 13/292,180

(22) Filed: Nov. 9, 2011

(65) Prior Publication Data

US 2012/0120082 A1  May 17, 2012

Related U.S. Application Data

(60) Provisional application No. 61/412,952, filed on Nov. 12, 2010.

(30) Foreign Application Priority Data

Jan. 18, 2011 (KR) .................. 10-2011-0005020

(51) Int. Cl.
 G09G 3/10 (2006.01)
 G09G 3/36 (2006.01)
 H03K 19/003 (2006.01)
 H03K 19/0185 (2006.01)
(52) U.S. Cl.
 CPC .. H03K 19/00315 (2013.01); H03K 19/018521 (2013.01)
 USPC ........................................ 345/42; 345/100

(58) Field of Classification Search
 CPC .................. G09G 2310/0289; G09G 2310/08
 USPC ....................................................... 345/42, 100
 See application file for complete search history.

(56) References Cited

U.S. PATENT DOCUMENTS

| | | | |
|---|---|---|---|
| 7,808,294 B1* | 10/2010 | Kottapalli | 327/333 |
| 7,934,036 B2* | 4/2011 | Conti et al. | 710/261 |
| 2002/0118040 A1* | 8/2002 | Salminen | 326/81 |
| 2003/0210026 A1* | 11/2003 | Clark et al. | 323/351 |
| 2006/0261851 A1* | 11/2006 | Kim | 326/81 |
| 2011/0156938 A1* | 6/2011 | Lee | 341/101 |

FOREIGN PATENT DOCUMENTS

| | | |
|---|---|---|
| JP | 11-214981 A | 8/1999 |
| JP | 2001-085990 A | 3/2001 |
| KR | 10-0173075 B1 | 10/1998 |
| KR | 10 2006-0119667 A | 11/2006 |

\* cited by examiner

*Primary Examiner* — Hau Nguyen
(74) *Attorney, Agent, or Firm* — Lee & Morse, P.C.

(57) ABSTRACT

Disclosed is a level shifter that includes an input node; first and second voltage shifter circuits configured to generate an output clock of a second voltage domain in response to an input clock of a first voltage domain input via the input node, and an output node configured to output the output clock, wherein the first and second voltage shifter circuits have the same structure and are connected in parallel between the input node and an output node.

20 Claims, 19 Drawing Sheets

LEVEL SHIFTER, SYSTEM-ON-CHIP INCLUDING THE SAME, AND MULTIMEDIA DEVICE INCLUDING THE SAME

CROSS-REFERENCE TO RELATED APPLICATIONS

The present application claims priority under 35 U.S.C. §119(e) to U.S. Provisional Application No. 61/412,952, filed Nov. 12, 2010. Korean Patent Application No. 10-2011-0005020, filed on Jan. 18, 2011 and entitled: "Level Shifter, System-On-Chip Including the Same, and Multimedia Device Including the Same." Both applications are incorporated herein by reference in its entirety.

BACKGROUND

1. Field

Exemplary embodiments relate to an electronic circuit, and more particularly, relate to a level shifter, a system-on-chip including the same, and a multimedia device including the same.

2. Description of the Related Art

A level shifter may be a component which receives a signal of a first voltage domain and outputs a signal of a second voltage domain different from the first voltage domain. The level shifter may be used between voltage domains in which different voltages are used.

A system-on-chip (SOC) may include a plurality of intellectual property (IP) blocks and a processor. The processor may operate relatively rapidly as compared with the IP blocks. In order to improve the performance of the processor, a voltage level of a clock supplied to the processor may be set to be higher than that supplied to the IP blocks. The system-on-chip may use a level shifter to increase a voltage level of a clock supplied to the processor.

SUMMARY

One or more embodiments provide a level shifter which comprises an input node, first and second voltage shifter circuits configured to generate an output clock of a second voltage domain in response to an input clock of a first voltage domain input via the input node, and an output node outputting the output clock, wherein the first and second voltage shifter circuits have the same structure and are connected in parallel between the input node and an output node.

The first voltage shifter circuit may include at least two inverters operating at the second voltage domain.

The second voltage shifter circuit may include at least one inverter operating at the first voltage domain and at least one inverter operating at the second voltage domain.

The at least one inverter operating at the second voltage domain may be configured to receive an output of the at least one inverter operating at the first voltage domain.

The first voltage shifter circuit may include a first inverter configured to output a second voltage or a ground voltage according to a voltage of the input node, and a second inverter configured to output the second voltage or the ground voltage to the output node according to an output of the first inverter, and the second voltage shifter circuit comprises a third inverter configured to output the first voltage or the ground voltage according to a voltage of the input node, and a fourth inverter configured to output the second voltage or the ground voltage to the output node according to an output of the third inverter.

The first to fourth inverters may be CMOS inverters.

One or more embodiments provide a system-on-chip including a phase locked loop configured to generate a first clock of a first voltage domain, a peripheral block, an audio block, a display block, a graphic block, an image processing block, and a codec block operating in response to the first clock, a level shifter configured to generate a second clock of a second voltage domain based upon the first clock, and a processor operating in response to the second clock, wherein the level shifter includes the first and second voltage shifter circuits which are configured to have the same structure and are connected in parallel between an input node and an output node.

The first voltage shifter circuit may include a first inverter and a second inverter connected in series and configured to operate at the second voltage domain, and the second voltage shifter circuit comprises a third inverter configured to operate at the first voltage domain, and a fourth inverter configured to operate at the second voltage domain.

A voltage of the second voltage domain may be higher in level than that of the first voltage domain.

One or more embodiments provide a multimedia device which comprises a processor, a working memory of the processor, a modem configured to communicate with the outside according to a control of the processor, a storage unit configured to store data according to a control of the processor, a user interface configured to sense an external signal and to transfer the sensed signal to the processor, a display control unit configured to display an image via a display unit according to a control of the processor, a sound control unit configured to output a sound via a speaker according to a control of the processor, a codec unit configured to perform encoding and decoding operations according to a control of the processor, a clock generating unit configured to generate a clock according to an output of an oscillator, a phase locked loop configured to generate a first clock of a first voltage domain synchronized with the clock, and a level shifter configured to generate a second clock of a second voltage domain in response to the first clock, wherein the processor operates in response to the second clock, and wherein the level shifter includes the first and second voltage shifter circuits which are configured to have the same structure and are connected in parallel between an input node and an output node.

The level shifter may include a first inverter configured to output a second voltage of the second voltage domain or a ground voltage according to a voltage of the input node, a second inverter configured to output the second voltage or the ground voltage to the output node according to an output of the first inverter, a third inverter configured to output the first voltage of the first voltage domain or the ground voltage according to a voltage of the input node, and a fourth inverter configured to output the second voltage or the ground voltage to the output node according to an output of the third inverter.

In this embodiment, the processor, the working memory, the display control unit, the sound control unit, the codec unit, and the phase locked loop constitute a system-on-chip, and the working memory, the display control unit, the sound control unit, and the codec unit operate in response to the first clock.

The multimedia device may include an image processing unit configured to process image data taken via a camera according to a control of the processor.

The processor, the display control unit, the sound control unit, the image processing unit, the working memory, the codec unit, and the phase locked loop may be provided as a system-on-chip, and the working memory, the display control unit, the sound control unit, the image processing unit, and the codec unit may operate in response to the first clock.

The processor, the display control unit, the sound control unit, the modem, the image processing unit, the working memory, the codec unit, and the phase locked loop may be provided as a system-on-chip, and the display control unit, the sound control unit, the modem, the image processing unit, the working memory, and the codec unit may operate in response to the first clock.

The processor, the display control unit, the sound control unit, the working memory, the codec unit, and the phase locked loop may be provided as a system-on-chip, and the display control unit, the sound control unit, the working memory, and the codec unit may operate in response to the first clock.

In this embodiment, the processor, the display control unit, the sound control unit, the working memory, and the phase locked loop may be provided as a system-on-chip, and the display control unit, the sound control unit, and the working memory may operate in response to the first clock.

In this embodiment, the processor, the display control unit, the working memory, and the phase locked loop may be provided as a system-on-chip, and the display control unit and the working memory may operate in response to the first clock.

In this embodiment, the processor, the working memory, and the phase locked loop may be provided as a system-on-chip, and the working memory may operate in response to the first clock.

In this embodiment, the processor, the sound control unit, the working memory, and the phase locked loop may be provided as a system-on-chip, and the sound control unit and the working memory may operate in response to the first clock.

In this embodiment, the processor, the working memory, modem, the storage unit, the user interface, the display control unit, the display unit, the sound control unit, the speaker, the oscillator, the clock generating unit, the camera, an image processing unit, the codec unit, and the phase locked loop may be included in a mobile device.

In this embodiment, the processor, the working memory, modem, the storage unit, the user interface, the display control unit, the display unit, the sound control unit, the speaker, the oscillator, the clock generating unit, the camera, an image processing unit, the codec unit, and the phase locked loop be included in a smart television.

One or more embodiments provide a level shifter, including a first voltage shifter circuit, and a second voltage shifter circuit connected in parallel with the first voltage shifter circuit between an input node and an output node, wherein a second clock of a second voltage domain is output from the output node in response to a first clock of a first voltage domain input at the input node, and a delay time between a rising edge of the first clock and a rising edge of the second clock is identical to a delay time between a falling edge of the first clock and a falling edge of the second clock.

BRIEF DESCRIPTION OF THE FIGURES

Features will become more apparent to those of ordinary skill in the art by describing in detail exemplary embodiments with reference to the attached drawings, in which.

DETAILED DESCRIPTION

Figure 1:
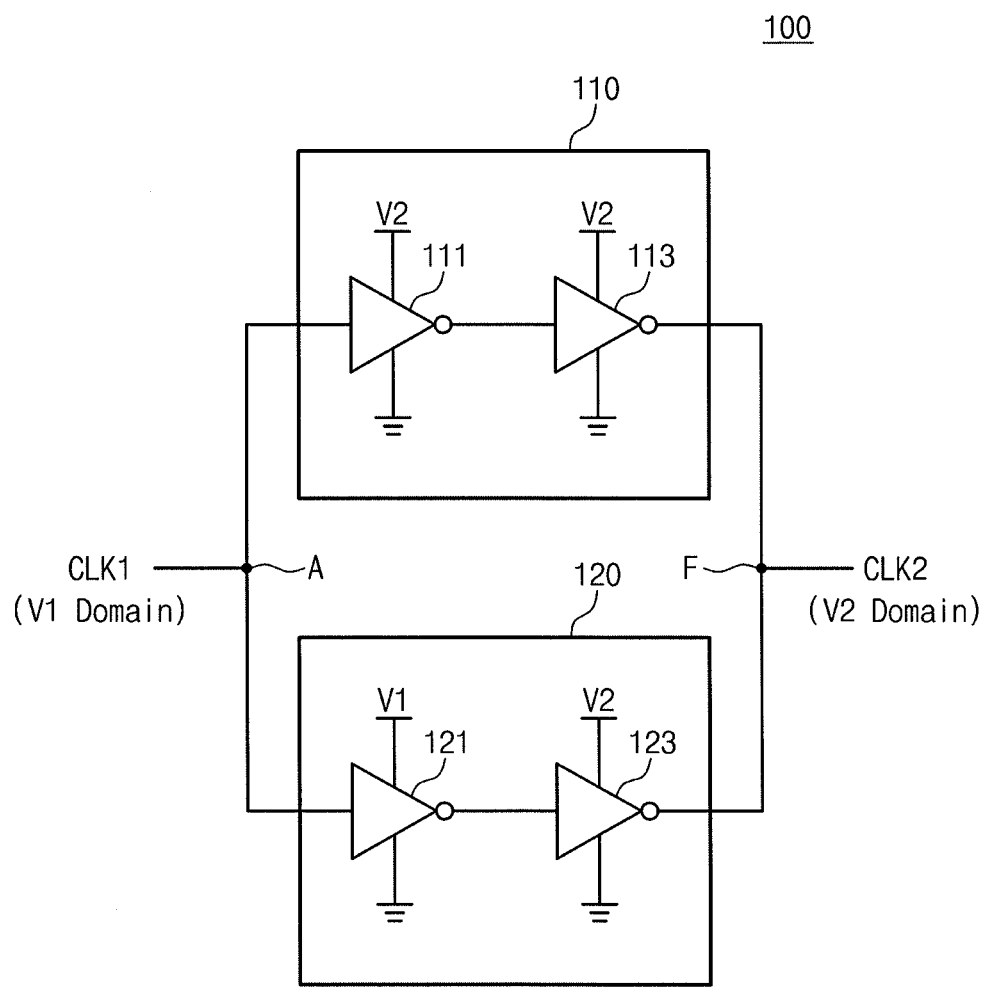
FIG. 1 illustrates a block diagram of an exemplary embodiment of a level shifter.

Exemplary embodiments are described more fully hereinafter with reference to the accompanying drawings, in which features of the inventive concept are shown. Features may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout the specification.

FIG. 1 illustrates a block diagram of an exemplary embodiment of a level shifter 100. Referring to FIG. 1, the level shifter 100 may include a plurality of voltage shifter circuits, e.g., a first voltage shifter circuit 110 and a second voltage shifter circuit 120. The first and second voltage shifter circuits 110 and 120 may be connected in parallel between an input node A and an output node F.

The first voltage shifter circuit 110 may receive a first clock CLK1 of a first voltage domain corresponding to a first voltage V1 via the input node A. The first clock CLK1 may have a swing width of the first voltage V1. The first voltage shifter circuit 110 may generate a signal of a second domain corresponding to a second voltage V2 based upon the first clock CLK1. A second clock CLK2 may have a swing width of the second voltage V2.

The first voltage shifter circuit 110 may include a plurality of inverters, e.g., first and second inverters 111 and 113. The first inverter 111 may output one of the second voltage V2 and a ground voltage VSS in response to the first clock CLK1. The second inverter 113 may output one of the second voltage V2 and the ground voltage VSS in response to an output of the first inverter 111. That is, the second inverter 113 may output a signal of the second voltage domain synchronized with the first clock CLK1.

The second voltage shifter circuit 120 may receive the first clock CLK1 of the first voltage domain via the input node A. The second voltage shifter circuit 120 may generate a signal of the second voltage domain based upon the first clock CLK1.

The second voltage shifter circuit 120 may include a plurality of inverters. The second voltage shifter circuit 120 may be configured the same as the first voltage shifter circuit 110. For example, the second voltage shifter circuit 120 may include third and fourth inverters 121 and 123. The third inverter 121 may output one of the first voltage V1 and the ground voltage VSS in response to the first clock CLK1. The fourth inverter 123 may output one of the second voltage V2 and the ground voltage VSS in response to an output of the third inverter 121. That is, the fourth inverter 123 may output a signal of the second voltage domain synchronized with the first clock CLK1.

Outputs of the first and second voltage shifter circuits 110 and 120 may be mixed at the output node F. The first voltage shifter circuit 110 may output a signal of the second voltage domain synchronized with the first clock CLK1. The second voltage shifter circuit 120 may output a signal of the second voltage domain synchronized with the first clock CLK1. That is, a signal of the second voltage domain synchronized with the first clock CLK1 may be output from the output node F. A signal of the output node F may be output as the second clock CLK2 of the second voltage domain.

Figure 2:
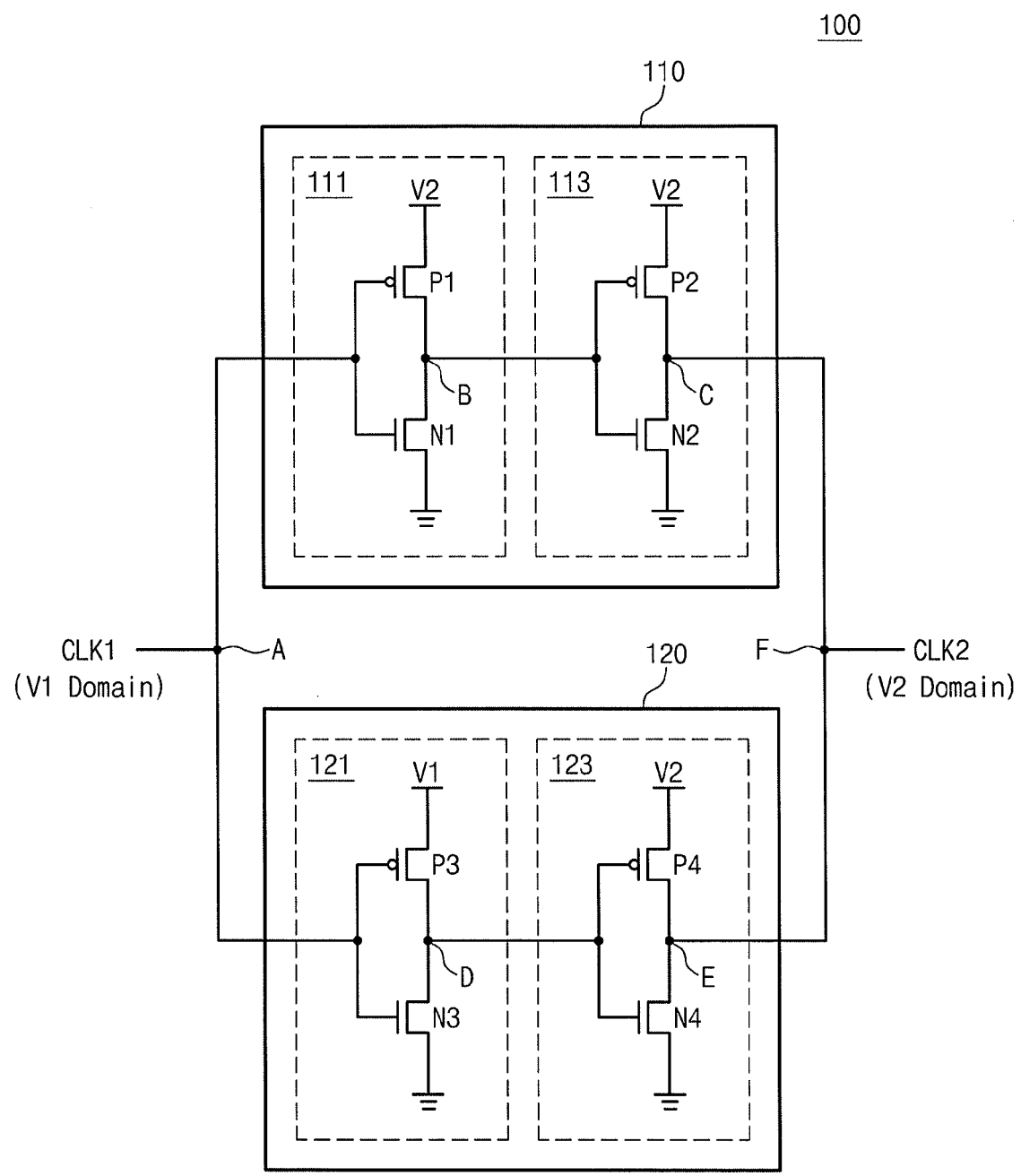
FIG. 2 illustrates a circuit diagram of an exemplary embodiment of the level shifter of FIG. 1.

FIG. 2 illustrates a circuit diagram of an exemplary embodiment of the level shifter 100 of FIG. 1. In FIG. 2, there are exemplarily illustrated internal circuits of first to fourth inverters 111, 113, 121, 123 described with reference to FIG. 1. In one or more embodiments, e.g., one, some or all of the inverters, e.g., 111, 113, 121, 123 may include a CMOS inverter.

Referring to FIGS. 1 and 2, the first inverter 111 may include a first PMOS transistor P1 and a first NMOS transistor N1. The first PMOS transistor P1 may have a gate connected to an input node A. One end of the first PMOS transistor P1 may be supplied with a second voltage V2, and another end thereof may be connected with an output node B. A gate of the first NMOS transistor N1 may be connected to the input node A. One end of the first NMOS transistor N1 may be grounded, and another end thereof may be connected with the output node B.

The second inverter 113 may have the same structure as the first inverter 111. The second inverter 113 may include a second PMOS transistor P2 and a second NMOS transistor N2. A gate of the second PMOS transistor P2 may be connected to the output node B, that is, an output of the first inverter 111. One end of the second PMOS transistor P2 may be supplied with the second voltage V2, and another end thereof may be connected with an output node C. A gate of the second NMOS transistor N2 may be connected to the output node B. One end of the second NMOS transistor N2 may be grounded, and another end thereof may be connected with the output node C.

The third inverter 121 may have the same structure as the first inverter 111. The third inverter 121 may include a third PMOS transistor P3 and a third NMOS transistor N3. The third PMOS transistor P3 may have a gate connected to the input node A. One end of the third PMOS transistor P3 may be supplied with a first voltage V1 and another end thereof may be connected with an output node D. A gate of the third NMOS transistor N3 may be connected to the input node A. One end of the third NMOS transistor N3 may be grounded, and another end thereof may be connected with the output node D.

The fourth inverter 123 may have the same structure as the first inverter 111. The fourth inverter 123 may include a fourth PMOS transistor P4 and a fourth NMOS transistor N4. A gate of the fourth PMOS transistor P4 may be connected to the output node D, that is, an output of the third inverter 121. One end of the fourth PMOS transistor P4 may be supplied with the second voltage V2, and another end thereof may be connected with an output node E. A gate of the fourth NMOS transistor N4 may be connected to the output node D. One end of the fourth NMOS transistor N4 may be grounded, and another end thereof may be connected with the output node E.

The output node C may be connected to the output node E as the output node F.

Figure 3:
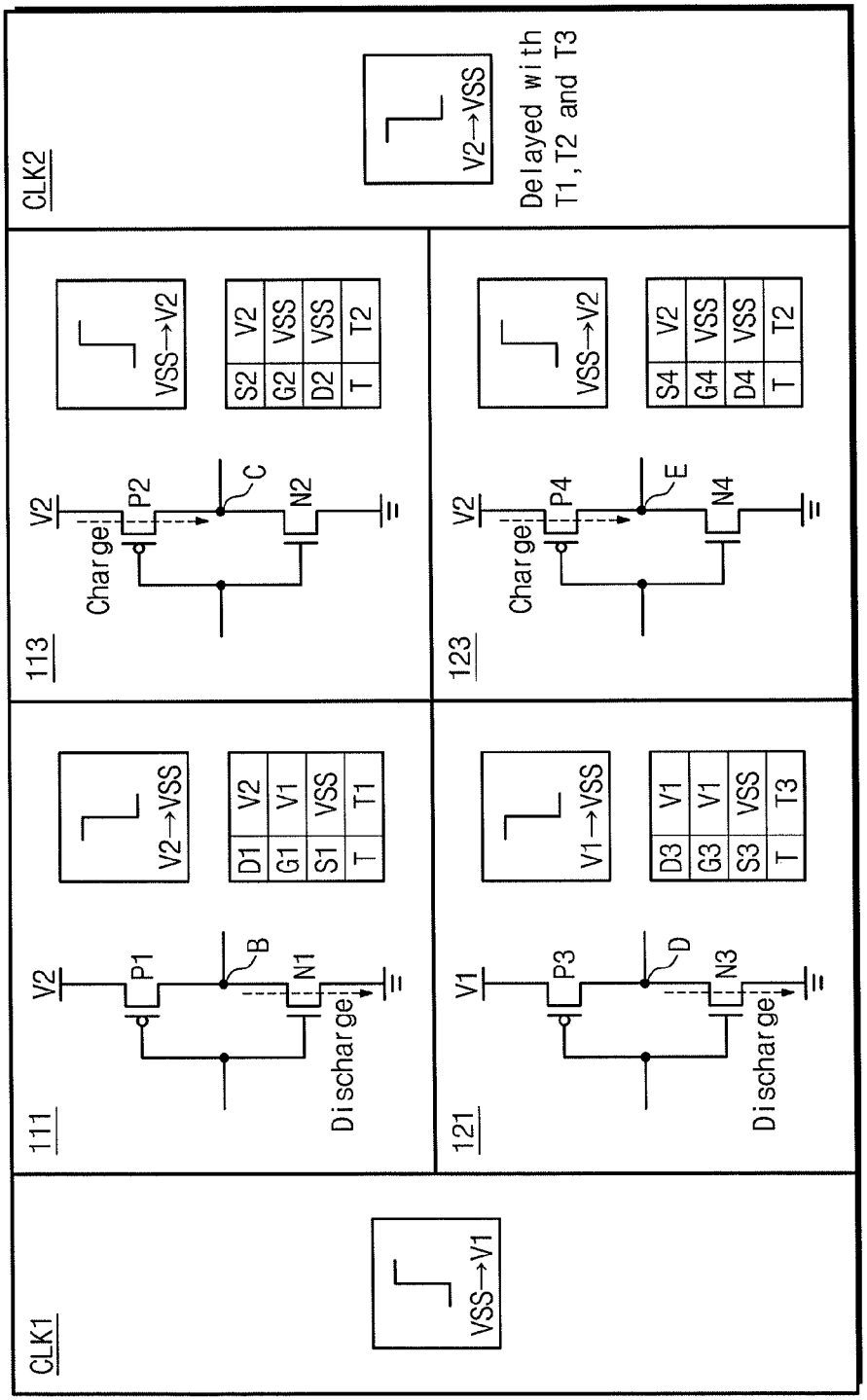
FIG. 3 illustrates a diagram of exemplary operations of first to fourth inverters of FIG. 2 during a low-to-high transition of a first clock.

FIG. 3 illustrates a diagram of exemplary operations of first to fourth inverters 111, 113, 131, 123 of FIG. 2 during a low-to-high transition of the first clock CLK1. Referring to FIGS. 2 and 3, a voltage of the first clock CLK1 may rise up to a first voltage V1 from the ground voltage VSS. When the first clock CLK1 has the first voltage V1, a first PMOS transistor P1 of a first inverter 111 may be turned off, and a first NMOS transistor N1 thereof may be turned on. That is, an output node B of the first inverter 111 may be grounded.

When the first clock CLK1 has the ground voltage VSS, a second voltage V2 may be supplied to the output node B of the first inverter 111 via the first PMOS transistor P1. When a voltage of the first clock CLK1 may rise up to the first voltage V1 from the ground voltage VSS, a voltage of the output node B of the first inverter 111 may be discharged to the ground voltage VSS from the second voltage V2.

In particular, a voltage of the output node B may be discharged via a channel of the first NMOS transistor N1 under the condition that the second voltage V2 is applied to a drain D1 of the first NMOS transistor N1, the first voltage V1 is applied to a gate G1 thereof, and the ground voltage VSS is applied to a source S1 thereof. A time taken to discharge a voltage of the output node B of the first inverter 111 to the ground voltage VSS may be referred to as a first time T1. The first time T1 may be a delay time generated when a voltage of the output node B falls to the ground voltage VSS in synchronization with a rising edge of the first clock CLK1.

When an output voltage of the first inverter 111 is the ground voltage VSS, the second NMOS transistor N2 of the second inverter 113 may be turned off and the second PMOS transistor P2 thereof may be turned on. That is, the second voltage V2 may be supplied to the output node C of the second inverter 113.

When an output voltage of the first inverter 111 is the second voltage V2, the ground voltage VSS may be supplied to the output node C of the second inverter 113 via the second NMOS transistor N2. When the output voltage of the first inverter 111 is at the ground voltage VSS, e.g., transitions from the second voltage V2 to the ground voltage VSS, the output node C of the second inverter 113 may be charged up to the second voltage V2 from the ground voltage VSS.

More particularly, e.g., the output node C may be charged via a channel of the second PMOS transistor P2 when the second voltage V2 is applied to a source S2 of the second PMOS transistor P2 and a gate G2 and a drain D2 of the second PMOS transistor P2 are grounded. A time taken to charge the output node B of the first inverter 111 to the second voltage V2 may be referred to as a second time T2. The second time T2 may be a delay time generated when a voltage of the output node C rises up to the second voltage V2 in synchronization with a falling edge of an output voltage of the first inverter 111.

A voltage of the first clock CLK1 may transition from the ground voltage VSS to the first voltage V1. When the first clock CLK1 has the first voltage V1, the third PMOS transistor P3 of a third inverter 121 may be turned off and a third NMOS transistor N3 thereof may be turned on. That is, an output node D of the third inverter 121 may be grounded.

When the first clock CLK1 has the ground voltage VSS, the first voltage V1 may be supplied to the output node D of the third inverter 121 via the third PMOS transistor P3. When a voltage of the first clock CLK1 rises up to the first voltage V1 from the ground voltage VSS, a voltage of the output node D of the third inverter 121 may be discharged to the ground voltage VSS from the first voltage V1.

More particularly, e.g., a voltage of the output node D may be discharged via a channel of the third NMOS transistor N3 when the first voltage V1 is applied to a drain D3 of the third NMOS transistor N3, the first voltage V1 is applied to a gate G3 thereof, and the ground voltage VSS is applied to a source S3 thereof. A time taken to discharge a voltage of the output node D of the third inverter 121 to the ground voltage VSS may be referred to as a third time T3. The third time T3 may be a delay time generated when a voltage of the output node D falls to the ground voltage VSS in synchronization with a rising edge of the first clock CLK1.

When an output voltage of the third inverter 131 is the ground voltage VSS, a fourth NMOS transistor N4 of a fourth inverter 123 may be turned on and a fourth PMOS transistor P4 thereof may be turned off. That is, the second voltage V2 may be supplied to an output node E of the fourth inverter 123.

When an output voltage of the third inverter 121 is the first voltage V1, the ground voltage VSS may be supplied to the output node E of the third inverter 123 via the fourth NMOS transistor N4. The output node E of the fourth inverter 123 may be charged up to the second voltage V2 from the ground voltage VSS when the output voltage of the third inverter 121 transitions from the first voltage V1 to the ground voltage VSS.

More particularly, e.g., the output node E may be charged to the second voltage V2 via a channel of the fourth PMOS transistor P4 when the second voltage V2 is applied to a source S2 of the second PMOS transistor P2 and a gate G2 and a drain D2 of the fourth PMOS transistor P4 are grounded. In one or more embodiments, a bias condition of the fourth PMOS transistor P4 of the fourth inverter 123 may be identical to that of the second PMOS transistor P2 of the second inverter 113. In such embodiments, a time taken to charge the output node E of the fourth inverter 123 to the second voltage V2 may also correspond to the second time T2. The second time T2 may be a delay time generated when a voltage of the output node E rises up to the second voltage V2 in synchronization with a falling edge of an output voltage of the third inverter 121.

Figure 4:
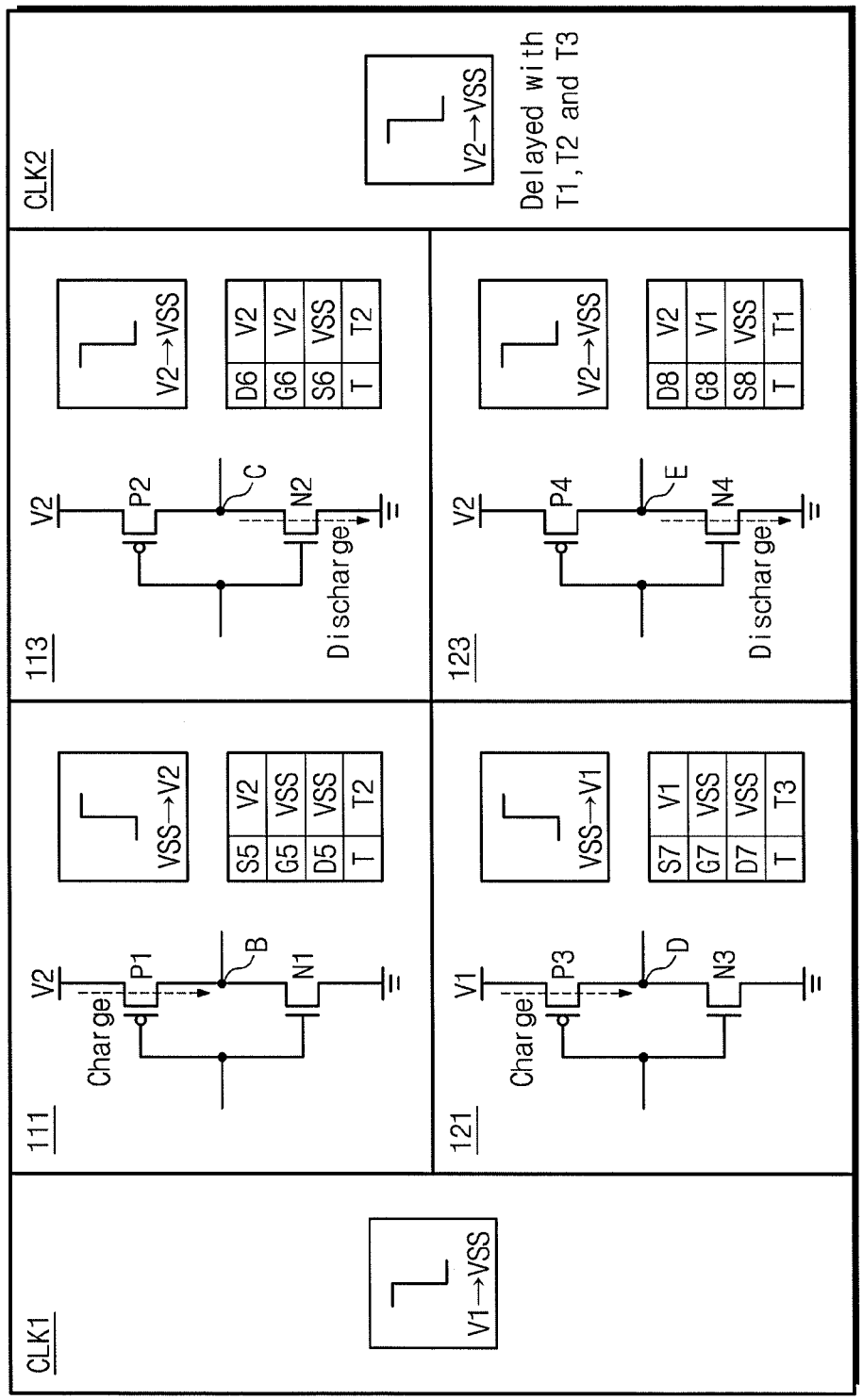
FIG. 4 illustrates a diagram of exemplary operations of first to fourth inverters of FIG. 2 during a high-to-low transition of a first clock.

FIG. 4 illustrates a diagram of exemplary operations of first to fourth inverters 111, 113, 121, 123 of FIG. 2 during a high-to-low transition of the first clock CLK1. Referring to FIGS. 2 and 4, a voltage of a first clock CLK1 may transition from the first voltage V1 to the ground voltage VSS. When the first clock CLK1 has the ground voltage VSS, the first PMOS transistor P1 of the first inverter 111 may be turned on and the first NMOS transistor N1 thereof may be turned off. That is, the output node B of the first inverter 111 may be supplied with a second voltage V2.

When the first clock CLK1 has the first voltage V1, the ground voltage VSS may be supplied to the output node B of the first inverter 111 via the first NMOS transistor N1. When a voltage of the first clock CLK1 falls to the ground voltage VSS from the first voltage V1, a voltage of the output node B of the first inverter 111 may be charged to the second voltage V2 from the ground voltage VSS.

More particularly, e.g., the output node B may be charged via a channel of the first PMOS transistor P1 when the second voltage V2 is applied to a source S5 of the first PMOS transistor P1, the ground voltage VSS is applied to a gate G5 thereof, and the ground voltage VSS is applied to a drain D5 thereof. In one or more embodiments, a bias condition of the first PMOS transistor P1 may be identical to that of a second PMOS transistor P2 of a second inverter 113 described in FIG. 3. A time taken to charge the output node B of the first inverter 111 with the second voltage V2 may correspond to the second time T2. The second time T2 may be a delay time generated when the output node B is charged to the second voltage V2 in synchronization with a falling edge of the first clock CLK1.

When an output voltage of the first inverter 111 is the second voltage V2, a second NMOS transistor N2 of a second inverter 113 may be turned on and a second PMOS transistor P2 thereof may be turned off. That is, the ground voltage VSS may be supplied to an output node C of the second inverter 113.

When an output voltage of the first inverter 111 is the ground voltage VSS, the second voltage V2 may be supplied to the output node C of the second inverter 113. When the output voltage of the first inverter 111 rises up to the second voltage V2 from the ground voltage VSS, a voltage of the output node C of the second inverter 113 may be discharged from the second voltage V2 to the ground voltage VSS.

More particularly, e.g., a voltage of the output node C may be discharged via a channel of the second NMOS transistor N2 when the second voltage V2 is applied to a drain D6 of the second NMOS transistor N2, the second voltage V2 is applied to a gate G6 thereof, and the ground voltage is applied to a source S6 thereof.

A bias condition of the second NMOS transistor N2 may be identical to that of the first PMOS transistor P1 of the first inverter 111. A gate-source voltage difference of the second NMOS transistor N2 may be the second voltage V2, and a gate-source voltage difference of the first PMOS transistor P1 may be the second voltage V2. A source-drain voltage difference of the second NMOS transistor N2 may be the second voltage V2, and a source-drain voltage difference of the first PMOS transistor P1 may be the second voltage V2.

Each of the first to fourth inverters 111, 113, 121, 123 may include a PMOS transistor and an NMOS transistor. When input voltages of the first to fourth inverters 111, 113, 121, 123 have a low level, output voltages of the first to fourth inverters 111, 113, 121, 123 may be generated by PMOS transistors P1, P2, P3, P4, respectively. When input voltages of the first to fourth inverters 111, 113, 121, 123 have a high level, output voltages of the first to fourth inverters 111, 113, 121, 123 may be generated by NMOS transistors N1, N2, N3, N4, respectively.

The first to fourth inverters 111, 113, 121, 123 may include symmetric low-level and high-level outputs. For example, the first to fourth inverters 111, 113, 121, 123 may be formed such that an amount of current charged at an output of a high level is identical to an amount of current discharged at an output of a low level. The first to fourth NMOS transistors N1 to N4 may be formed to operate the same as the first to fourth PMOS transistors P1 to P4 under the same bias condition. An amount of current flowing via the second NMOS transistor N2 may be identical to that flowing via the first PMOS transistor P1 under the same bias condition.

In one or more embodiments, a bias condition of the second NMOS transistor N2 may be identical to that of the first PMOS transistor P1. In this case, a time taken to discharge a voltage of the output node C of the second inverter 113 may be referred to as the second time T2. The second time T2 may be a delay time generated when a voltage of the output node C of the second inverter 113 falls in synchronization with a rising edge of the output voltage of the first inverter 111.

When the first clock CLK1 has the ground voltage VSS, the third NMOS transistor N3 of the third inverter 121 may be turned off and the third PMOS transistor P3 may be turned on. The first voltage V1 may be supplied to an output node D of the third inverter 121.

When the first clock CLK1 has the first voltage V1, the ground voltage VSS may be supplied to the output node D of the third inverter 121 via the third NMOS transistor N3. When a voltage of the first clock CLK1 transitions from the first voltage V1 to the ground voltage VSS, the output node D of the third inverter 121 may be charged up to the first voltage V1 from the ground voltage VSS.

More particularly, e.g., the output node D may be charged via a channel of the third PMOS transistor P3 when the first voltage V1 is applied to a source S7 of the third PMOS transistor P3, the ground voltage VSS is applied to a gate G7 thereof, and the ground voltage VSS is applied to a drain D7 thereof.

A bias condition of the third PMOS transistor P3 may be identical to that of the third NMOS transistor N3 described with reference to FIG. 3. For example, a gate-source voltage difference of the third PMOS transistor P3 may be the first voltage V1, and a gate-source voltage difference of the third NMOS transistor N3 may be the first voltage V1. A source-drain voltage difference of the third PMOS transistor P3 may be the first voltage V1, and a source-drain voltage difference of the third NMOS transistor N3 may be the first voltage V1.

A time taken to charge the output node D of the third inverter 121 up to the first voltage V1 may be referred to as the third time T3. The third time T3 may be a delay time generated when a voltage of the output node D of the third inverter 121 rises in synchronization with a falling edge of the first clock signal CLK1.

When an output voltage of the third inverter 121 is the first voltage V1, the fourth PMOS transistor P4 of the fourth inverter 123 may be turned off and the fourth NMOS transistor N4 may be turned on. An output node E of the fourth inverter 123 may be grounded.

When the output voltage of the third inverter 121 is the ground voltage VSS, the second voltage V2 may be supplied to the output node E of the fourth inverter 123 via the fourth PMOS transistor P4. When the output voltage of the third inverter 121 transitions from the ground voltage VSS to the first voltage V1, a voltage of the output node E of the fourth inverter 123 may be discharged to the ground voltage VSS from the second voltage V2.

More particularly, e.g., a voltage of the output node E may be discharged via a channel of the fourth PMOS transistor P4 when the second voltage V2 is applied to a drain D8 of the fourth NMOS transistor N4, the first voltage V1 is applied to a gate G8 thereof, and the ground voltage VSS is applied to a source S8 thereof.

At this time, a bias condition of the fourth NMOS transistor N4 of the fourth inverter 123 may be identical to that of the first NMOS transistor N1 described with reference to FIG. 3. A time taken to discharge a voltage of the output node E of the fourth inverter 123 may be referred to the first time T1. The first time T1 may be a delay time generated when a voltage of the output node E of the fourth inverter 123 falls in synchronization with a rising edge of an output voltage of the third inverter 121.

Figure 5:
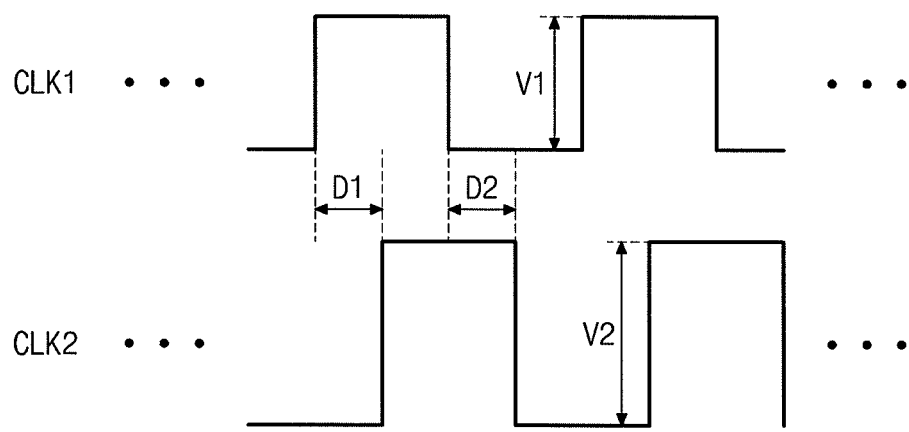
FIG. 5 illustrates a timing diagram of an exemplary relationship between input and output clocks of one or more embodiments of a level shifter employing one or more features described herein.

FIG. 5 illustrates an exemplary timing diagram of an exemplary relationship between input and output clocks CLK1, CLK2 of one or more embodiments of a level shifter, e.g., 100, employing one or more features described herein.

Referring to FIGS. 1 to 5, a first clock CLK1 may be applied to the level shifter 100. The first clock CLK1 may have a swing width of the first voltage V1. The first clock CLK1 may have rising and falling edges which are repeated periodically.

A second clock CLK2 may be output from the level shifter 100. The second clock CLK2 may have a swing width of the second voltage V2. The second clock CLK2 may be generated in synchronization with a rising edge of the first clock CLK1. The second clock CLK2 may rise by charging and discharging of first and second inverters 111, 113 of the first voltage shifter circuit 110 and charging and discharging of third and fourth inverters 121, 123 of the second voltage shifter circuit 120.

As described with reference to FIG. 3, after the first clock CLK1 rises and the first time T1 elapses, an output voltage of the first inverter 111 may reach a ground voltage VSS. After an output voltage of the first inverter 111 falls and the second time T2 elapses, an output voltage of the second inverter 113 may reach the second voltage V2. After the first clock CLK1 rises and the third time T3 elapses, an output voltage of the third inverter 121 may reach the ground voltage VSS. After an output voltage of the third inverter 121 falls and the second time T2 elapses, an output voltage of the fourth inverter 123 may reach the second voltage V2.

The output voltages of the second and fourth inverters 113, 123 may be mixed to generate the second clock CLK2. A delay D1 between a rising edge of the first clock CLK1 and a rising edge of the second clock CLK2 may correspond to a sum of the first to third times T1 to T3.

As described with reference to FIG. 4, after the first clock CLK1 falls and the second time T2 elapses, an output voltage of the first inverter 111 may reach the second voltage V2. After an output voltage of the first inverter 111 rises and the second time T2 elapses, an output voltage of the second inverter 113 may reach the ground voltage VSS. After the first clock CLK1 falls and the third time T3 elapses, an output voltage of the third inverter 121 may reach the first voltage V1. After an output voltage of the third inverter 121 rises and the first time T1 elapses, an output voltage of the fourth inverter 123 may reach the ground voltage VSS.

Output voltages of the second and fourth inverters 113 and 123 may be mixed to generate the second clock CLK2. A delay D2 between a falling edge of the first clock CLK1 and a falling edge of the second clock CLK2 may be generated by mixing the first to third times T1 to T3.

Time factors T1, T2, T3 causing the delay D1 between rising edges of the first and second clocks CLK1 and CLK2 may be identical to those causing the delay D2 between falling edges thereof. Accordingly, the delay D1 between the rising edges of the first and second clocks CLK1 and CLK2 may be identical to the delay D2 between the falling edges thereof.

In the event that the delay D1 between rising edges is different from the delay D2 between falling edges, duty ratios of high-level and low-level periods of one cycle of the second clock CLK2 may be varied.

For example, if the delay D1 between rising edges is more than the delay D2 between falling edges, a duty ratio of a high-level period of a cycle of the second clock CLK2 may be reduced as compared with that of the first clock CLK1.

If the delay D2 between falling edges is more than the delay D1 between rising edges, a duty ratio of a low-level period of a cycle of the second clock CLK2 may be reduced as compared with that of the first clock CLK1. According to an exemplary embodiment of the inventive concept, the level shifter 100 may be configured such that a duty ratio of an input signal is identical to that of an output signal, and may generate a second clock CLK2 of a voltage domain different from that of a first clock CLK1. Accordingly, it is possible to improve the reliability of an output clock of the level shifter 100.

In embodiments, the second voltage V2 may be lower or higher in level than the first voltage V1.

Figure 6:
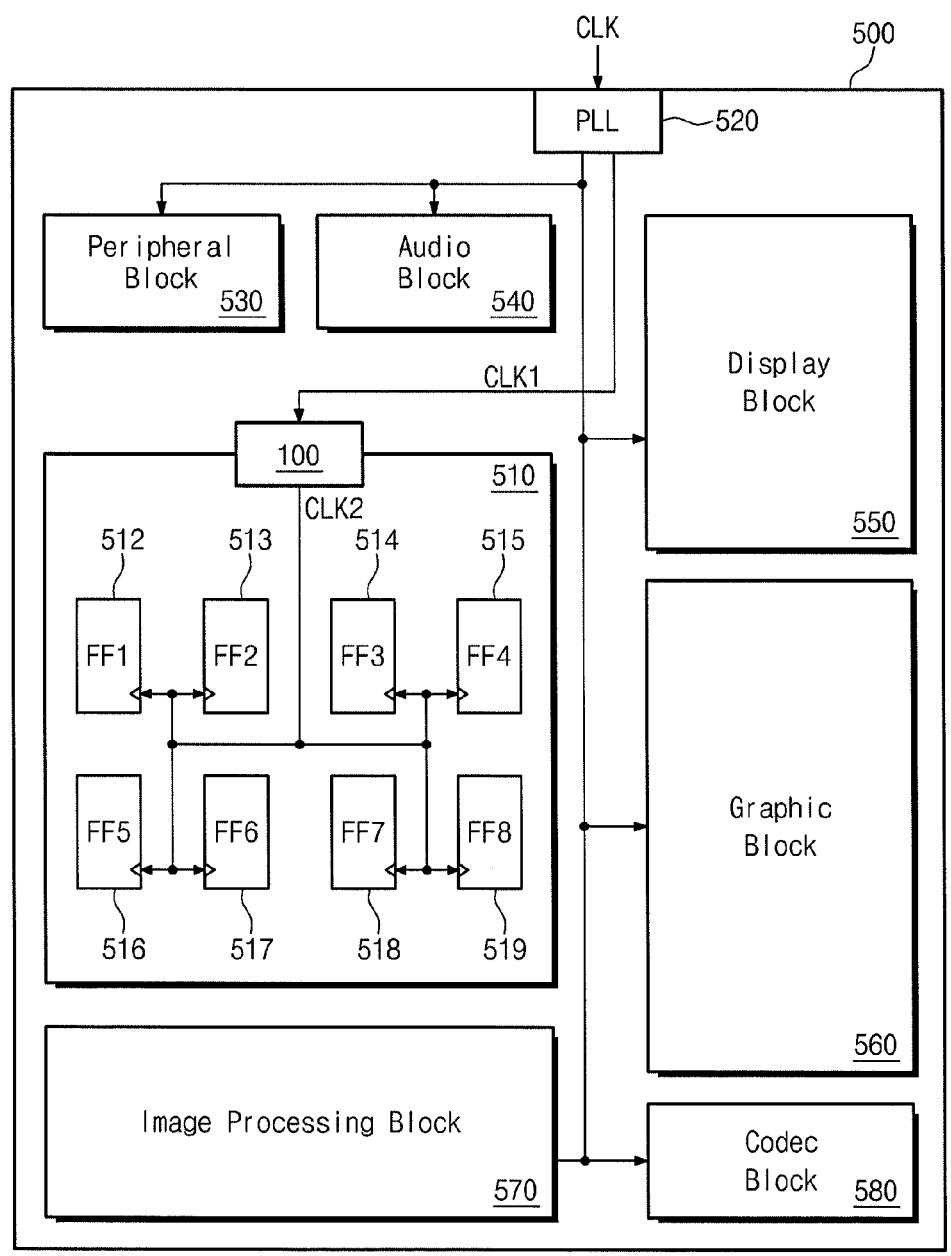
FIG. 6 illustrates a block diagram of an exemplary embodiment of a system-on-chip including an exemplary embodiment of a level shifter employing one or more features described herein.

FIG. 6 illustrates a block diagram of an exemplary embodiment of a system-on-chip 500 including the level shifter 100. Referring to FIG. 6, the system-on-chip 500 may include a processor 510, a phase locked loop (PLL) 520, a peripheral block 530, an audio block 540, a display block 550, a graphic block 560, an image processor block 570, and a codec block 580.

The processor 510 may include a plurality of flip-flops, e.g., first to eighth flip-flops 512 to 519. The processor 510 may further include the level shifter 100 or may be connected with the level shifter 100. The level shifter 100 may receive a first clock CLK1 from the PLL 520. The first clock CLK1 may have a swing width of a first voltage V1. The level shifter 100 may identically maintain duty ratios of high-level and low-level periods with respect to input and output clocks, and may generate a second clock CLK2 synchronized with the first clock CLK1. The second clock CLK2 may have a swing width of the second voltage V2. The second voltage V2 may be higher in level than the first voltage V1.

The second clock CLK2 generated from the level shifter 100 may be supplied to the flip-flops 512 to 519, respectively. The flip-flops 512 to 519 of the processor 510 may operate in response to the second clock CLK2.

The PLL 520 may receive a clock CLK from an external device. The PLL 520 may generate the first clock CLK1 synchronized with the input clock CLK. The first clock CLK1 may be supplied to the peripheral block 530, the audio block 540, the display block 550, the graphic block 560, the image processor block 570, and the codec block 580, respectively.

The peripheral block 530, the audio block 540, the display block 550, the graphic block 560, the image processor block 570, and the codec block 580 may operate in response to the first clock CLK1. The peripheral block 530, the audio block 540, the display block 550, the graphic block 560, the image processor block 570, and the codec block 580 may be an IP block.

The audio block 540 may process audio data. The display block 550 may generate signals for controlling a display device such as a monitor (not shown). The graphic block 560 may process graphic data to be displayed by the display device such as a monitor (not shown). The image processor block 570 may process image data taken by a pick-up device such as a camera (not shown). The codec block 580 may perform encoding or decoding of audio data. The codec block 580 may perform encoding or decoding of graphic data.

As illustrated in FIG. 6, the peripheral block 530, the audio block 540, the display block 550, the graphic block 560, the image processor block 570, and the codec block 580 within the system-on-chip 500 may operate in response to the first clock CLK1. The processor 510 may operate in response to the second clock CLK2 of a second voltage domain generated using the first clock CLK1. The second voltage V2 may be higher in level than the first voltage V1.

The level shifter 100 may be a level shifter described with reference to FIGS. 1 to 5. Exemplarily, the level shifter 100 may include first and second voltage shifter circuits 110 and 120 which are connected in parallel between an input node A and an output node F and are configured to have the same structure. In the level shifter 100, a delay D1 between a rising edge of an input clock CLK1 and a rising edge of an output clock CLK2 may be identical to a delay D2 between a falling edge of the input clock CLK1 and a falling edge of the output clock CLK2. Accordingly, circuits and/or devices, e.g., the processor 510 and/or SOC 500 including and/or operating in accordance with a level shifter including one or more features described herein, e.g., level shifter 100, may have improved reliability. Referring to the exemplary embodiment of FIG. 6, e.g., by operating in response to the second clock CLK2 generated by the level shifter 100 in which the delay D1 is identical to the delay D2, reliability of the processor 510 and/or the SOC 500 may be improved.

In embodiments in which the processor 510 is designed to operate at a high speed, the processor 510 may operate in synchronization with both a rising edge and a falling edge of the second clock CLK2. The level shifter 100 may maintain duty ratios of high-level and low-level periods, and may convert the first clock CLK1 of the first voltage domain into the second clock CLK2 of the second voltage domain. If the duty ratios of high-level and low-level periods are maintained identically, a margin (i.e., a duty ratio of a high-level period) between a rising edge and a falling edge of the second clock CLK2 may be maintained optimally. Accordingly, by employing a level shifter including one or more features described herein, e.g., the level shifter 100, it is possible to improve the reliabilities of the processor 510 and the system-on-chip 500 including the processor 510. The processor 510 may operate in synchronization with both edges (i.e., rising and falling edges) of the second clock CLK2.

Figure 7:
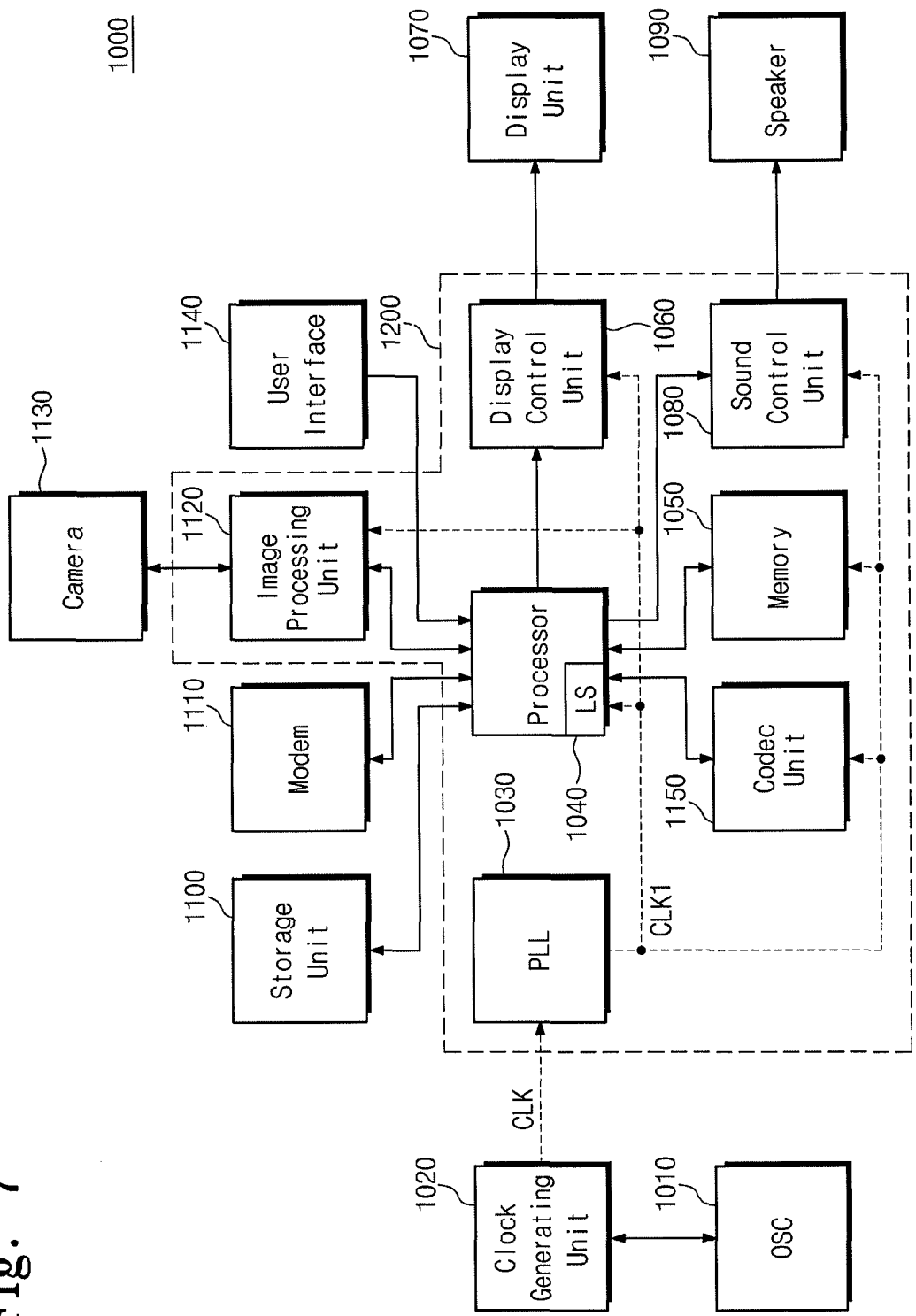
FIG. 7 illustrates a block diagram of an exemplary embodiment of a multimedia device including an exemplary embodiment of a level shifter employing one or more features described herein.

FIG. 7 illustrates a block diagram of an exemplary embodiment of a multimedia device 1000, including a level shifter employing one or more features described herein, e.g., level shifter 100. Referring to FIG. 7, the multimedia device 1000 may include an oscillator 1010, a clock generating unit 1020, a phase locked loop (PLL) 1030, a processor 1040, a memory 1050, a display control unit 1060, a display unit 1070, a sound control unit 1080, a speaker 1090, a storage unit 1100, a modem 1110, an image processing unit 1120, a camera 1130, a user interface 1140, and a codec unit 1150.

The oscillator 1010 may generate an oscillation signal oscillated according to a specific frequency. The oscillation signal may be supplied to the clock generating unit 1020.

The clock generating unit 1020 may generate a clock CLK in response to an oscillation signal supplied from the oscillator 1010. The clock CLK may be supplied to the PLL 1030.

The PLL 1030 may be configured to generate a first clock CLK1 in response to the clock CLK input from the clock generating unit 1020. The first clock CLK1 may be synchronized with the input clock CLK. The first clock CLK1 may be applied to the processor 1040.

The processor 1040 may be configured to control an overall operation of the multimedia device 1000. The processor 1040 may control hardware components of the multimedia device 1000. The processor 1040 may drive software components of the multimedia device 1000.

The processor 1040 may include a level shifter LS according to an exemplary embodiment of the inventive concept, or may be connected with the level shifter LS. The level shifter LS may generate a second clock CLK2 of a second voltage domain based upon the first clock CLK1 of the first voltage domain supplied from the PLL 1030. The second clock CLK2 may be used as an internal clock of the processor 1010.

The memory 1050 may be a working memory of the processor 1040. Exemplarily, the memory 1050 may include a volatile memory such as SRAM, DRAM, SDRAM, etc. or a nonvolatile memory such as PRAM, MRAM, RRAM, FRAM, a flash memory, etc.

The display control unit 1060 may operate in response to the control of the processor 1040. The display control unit 1060 may be configured to generate and control an image displayed via the display unit 1070. The display unit 1060 may include a graphic processing unit (GPU).

The display unit 1070 may be configured to display an image generated by the display control unit 1060. The display unit 1070 may include a liquid crystal display (LCD), an organic light emitting diode (OLED) display, an active matrix organic light emitting diode (AMOLED) display, an electronic pager, etc.

The sound control unit 1080 may operate responsive to the control of the processor 1040. The sound control unit 1080 may generate and control a sound to be output via the speaker 1090. The speaker 1090 may output a sound according to the control of the sound control unit 1080.

The storage unit 1100 may be configured to store data under the control of the processor 1040. The storage unit 1100 may include nonvolatile memories such as a flash memory, a PRAM, an MRAM, an RRAM, a FRAM, etc. The storage unit 1100 may include a hard disk drive (HDD), a solid state drive (SSD), etc.

The modem 1110 may communicate with an external device under the control of the processor 1040. Exemplarily, the modem 1110 may communicate with the external device via a wireless or wire channel. The modem 1110 may communicate with the external device according to wireless protocols such as CDMA (Code Division Multiple Access), GSM (Global System for Mobile communications), CDMA 2000, WCDMA (Wideband Code Division Multiple Access), LTE (Long Term Evolution), WiBro (Wireless Broadband Internet), Mobile WiMAX (World Interoperability), WiFi, etc. The modem 1110 may communicate with the external device according to wire protocols such as ADSL (Asymmetric Digital Subscriber Line), VDSL (Very high data rate Digital Subscriber Line), ISDN (Integrated Services Digital Network), etc.

The image processing unit 1130 may operate in response to the control of the processor 1040. The image processing unit 1130 may be configured to process image data taken by the camera 1140.

The user interface 1140 may be configured to transfer a signal sensed from the outside to the processor 1140. Exemplarily, the user interface 1120 may include a microphone, a touch pad, a touch screen, a button, a mouse, a keyboard, etc.

The codec unit 1150 may decode or encode audio data, video data, etc.

Exemplarily, the PLL 1030, the processor 1040, the memory 1050, the display control unit 1060, the sound control unit 1080, the image processing unit 1120, and the codec unit 1150 may be provided as a system-on-chip 1200. The system-on-chip 1200 may have a structure described with reference to FIG. 6. The processor 1040 may correspond to a processor 510 in FIG. 6. The memory 1050 may correspond to a peripheral block 530 in FIG. 6. The display control unit 1060 may correspond to display and graphic blocks 550 and 560 in FIG. 6. The sound control unit 1080 may correspond to an audio block 540 in FIG. 6. The image processing unit 1120 may correspond to an image processor block 570 in FIG. 6. The codec unit 1150 may correspond to a codec block 580 in FIG. 6.

The clock generating unit 1020 may supply the clock CLK to the system-on-chip 1200, and may supply components necessitating the clock CLK among components of the multimedia device 1000.

The PLL 1030 of the system-on-chip 1200 may generate the first clock CLK1 synchronized with the clock CLK. As described with reference to FIGS. 1 to 5, the level shifter LS may maintain duty ratios of high-level and low-level periods identically with respect to input and output clocks, and may generate the second clock CLK based upon the first clock CLK1. The processor 1040 may operate responsive to the second clock CLK2. Other components of the system-on-chip 1200, e.g., the memory 1050, the display control unit 1060, the sound control unit 1080, the image processing unit 1120, and the codec unit 1150 may operate responsive to the first clock CLK1.

Figure 8:
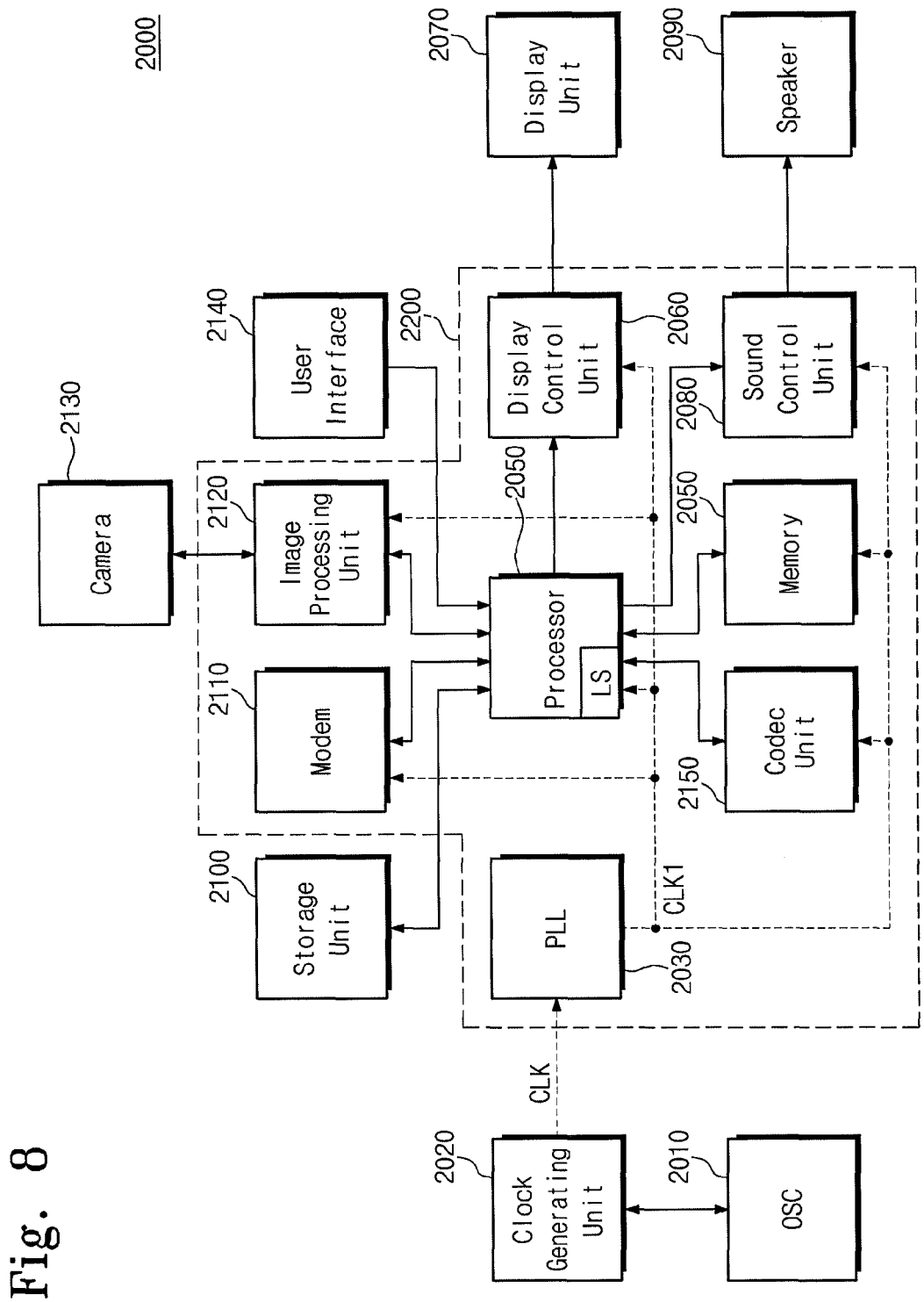
FIG. 8 illustrates a block diagram of an exemplary embodiment of a multimedia device including an exemplary embodiment of a level shifter employing one or more features described herein.

FIG. 8 illustrates a block diagram a multimedia device 2000 including an exemplary embodiment of a level shifter LS employing one or more features described herein, e.g., level shifter 100. Referring to FIG. 8, the multimedia device 2000 may include an oscillator 2010, a clock generating unit 2020, a phase locked loop (PLL) 2030, a processor 2040, a memory 2050, a display control unit 2060, a display unit 2070, a sound control unit 2080, a speaker 2090, a storage unit 2100, a modem 2110, an image processing unit 2120, a camera 2130, a user interface 2140, and a codec unit 2150.

In general, only differences between the multimedia device 1000 of FIG. 7 and the multimedia device 2000 of FIG. 8 will be described below. In the multimedia device 2000 of FIG. 8, the PLL 2030, the processor 2040, the memory 2050, the display control unit 2060, the sound control unit 2080, the modem 2110, the image processing unit 2120, and the codec unit 2150 may be provided as a system-on-chip 2200. The system-on-chip 2200 may have a structure described with reference to FIG. 6. The processor 2040 may correspond to a processor 510 in FIG. 6. The memory 2050 and the modem 2110 may correspond to the peripheral block 530 in FIG. 6. The display control unit 2060 may correspond to display and graphic blocks 550 and 560 in FIG. 6. The sound control unit 2080 may correspond to the audio block 540 in FIG. 6. The image processing unit 2120 may correspond to the image processor block 570 in FIG. 6. The codec unit 2150 may correspond to the codec block 580 in FIG. 6.

The clock generating unit 2020 may supply a clock CLK to the system-on-chip 2200, and may supply components necessitating the clock CLK among components of the multimedia device 2000.

The PLL 2030 of the system-on-chip 2200 may generate a first clock CLK1 synchronized with the clock CLK. As described with reference to FIGS. 1 to 5, the level shifter LS of the processor 2050 may maintain a duty ratio of high-level and low-level periods, and may generate a second clock CLK based upon the first clock CLK1. The processor 2040 may operate responsive to the second clock CLK2. Other components of the system-on-chip 2200, e.g., the memory 2050, the display control unit 2060, the sound control unit 2080, the modem 2110, the image processing unit 2120, and the codec unit 2150 may operate responsive to the first clock CLK1.

Figure 9:
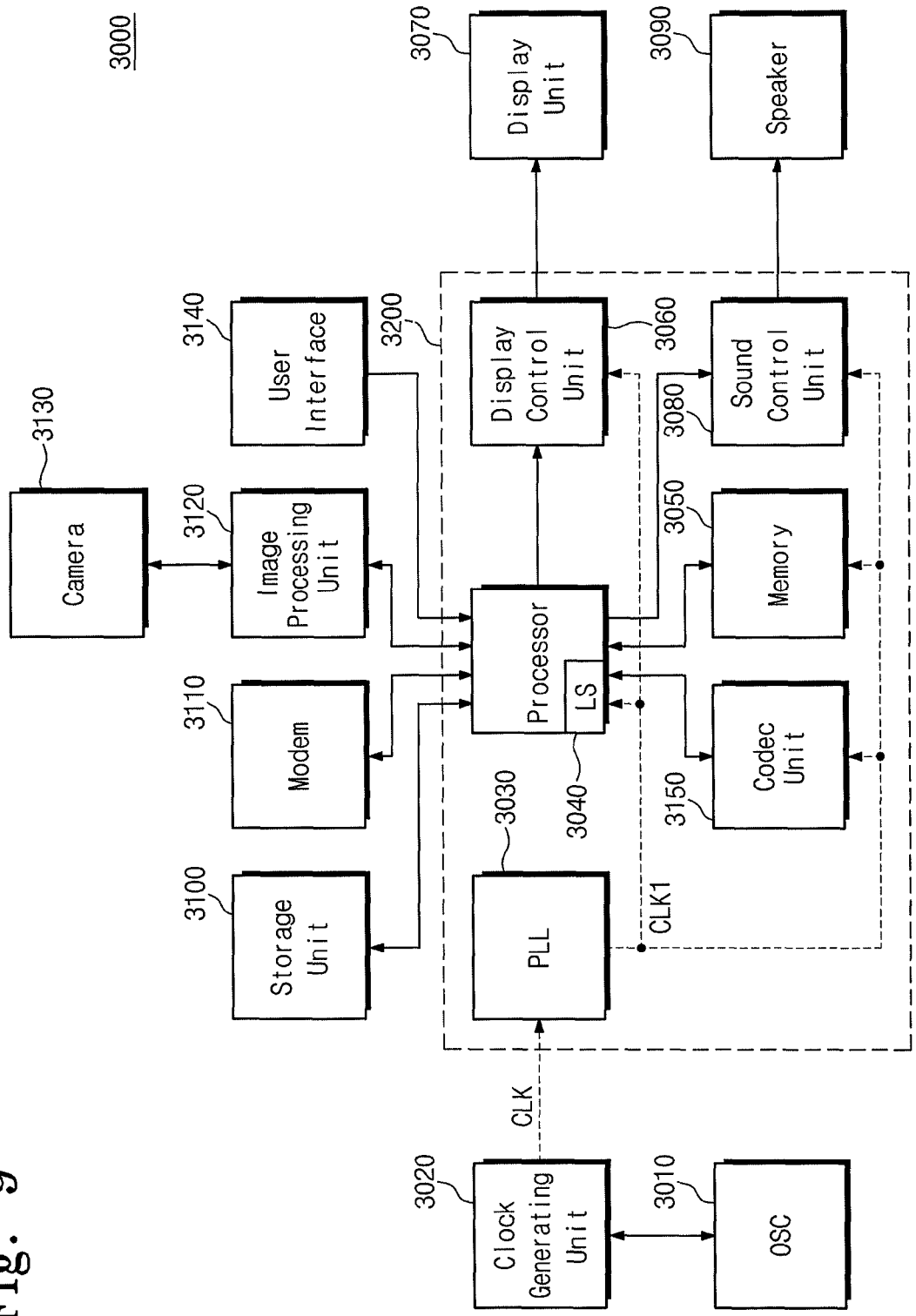
FIG. 9 illustrates a block diagram an exemplary embodiment of a multimedia device including another exemplary embodiment of a level shifter employing one or more features described herein.

FIG. 9 illustrates a block diagram a multimedia device 3000 including an exemplary embodiment of a level shifter LS employing one or more features described herein, e.g., level shifter 100. Referring to FIG. 9, the multimedia device 3000 may include an oscillator 3010, a clock generating unit 3020, a phase locked loop (PLL) 3030, a processor 3040, a memory 3050, a display control unit 3060, a display unit 3070, a sound control unit 3080, a speaker 3090, a storage unit 3100, a modem 3110, an image processing unit 3120, a camera 3130, a user interface 3140, and a codec unit 3150.

In general, only differences between the multimedia device 1000 of FIG. 1 and the multimedia device 3000 of FIG. 9 will be described below. In the multimedia device 3000 of FIG. 9, the PLL 3030, the processor 3040, the memory 3050, the display control unit 3060, the sound control unit 3080, and the codec unit 3150 may be provided as a system-on-chip 3200.

The clock generating unit 3020 may supply a clock CLK to the system-on-chip 3200, and may supply components necessitating the clock CLK among components of the multimedia device 3000.

The PLL 3030 of the system-on-chip 3200 may generate a first clock CLK1 synchronized with the clock CLK. As described with reference to FIGS. 1 to 5, a level shifter LS of the processor 3050 may maintain duty ratios of high-level and low-level periods identically with respect to input and output clocks, and may generate a second clock CLK based upon the first clock CLK1. The processor 3040 may operate responsive to the second clock CLK2. Other components of the system-on-chip 3200, e.g., the memory 3050, the display control unit 3060, the sound control unit 3080, and the codec unit 3150 may operate responsive to the first clock CLK1.

Figure 10:
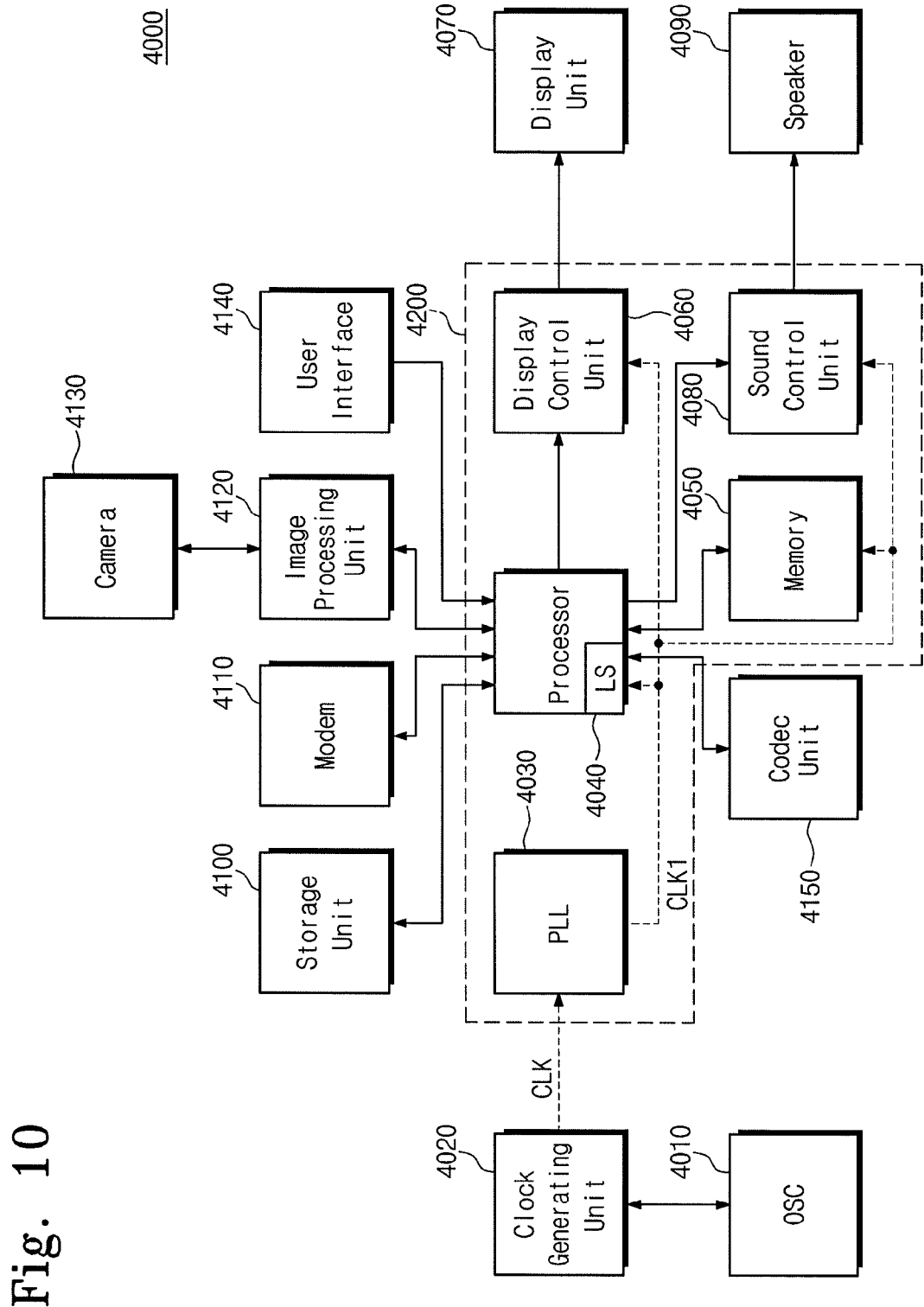
FIG. 10 illustrates a block diagram an exemplary embodiment of a multimedia device including another exemplary embodiment of a level shifter employing one or more features described herein.

FIG. 10 illustrates a block diagram a multimedia device 4000 including an exemplary embodiment of a level shifter LS employing one or more features described herein, e.g., level shifter 100. Referring to FIG. 10, the multimedia device 4000 may include an oscillator 4010, a clock generating unit 4020, a phase locked loop (PLL) 4030, a processor 4040, a memory 4050, a display control unit 4060, a display unit 4070, a sound control unit 4080, a speaker 4090, a storage unit 4100, a modem 4110, an image processing unit 4120, a camera 4130, a user interface 4140, and a codec unit 4150.

In general, only differences between the multimedia device 1000 of FIG. 7 and the multimedia device 4000 of FIG. 10 will e described below. Referring to FIG. 10, in the multimedia device 4000, the PLL 4030, the processor 4040, the memory 4050, the display control unit 4060, and the sound control unit 4080 may be provided as a system-on-chip 4200.

The clock generating unit 4020 may supply a clock CLK to the system-on-chip 4200, and may supply components necessitating the clock CLK among components of the multimedia device 4000.

The PLL 4030 of the system-on-chip 4200 may generate a first clock CLK1 synchronized with the clock CLK. As described with reference to FIGS. 1 to 5, a level shifter LS of the processor 4050 may maintain a duty ratio of high-level and low-level periods, and may generate a second clock CLK based upon the first clock CLK1. The processor 4040 may operate responsive to the second clock CLK2. Other components of the system-on-chip 4200, e.g., the memory 4050, the display control unit 4060, and the sound control unit 4080 may operate responsive to the first clock CLK1.

Figure 11:
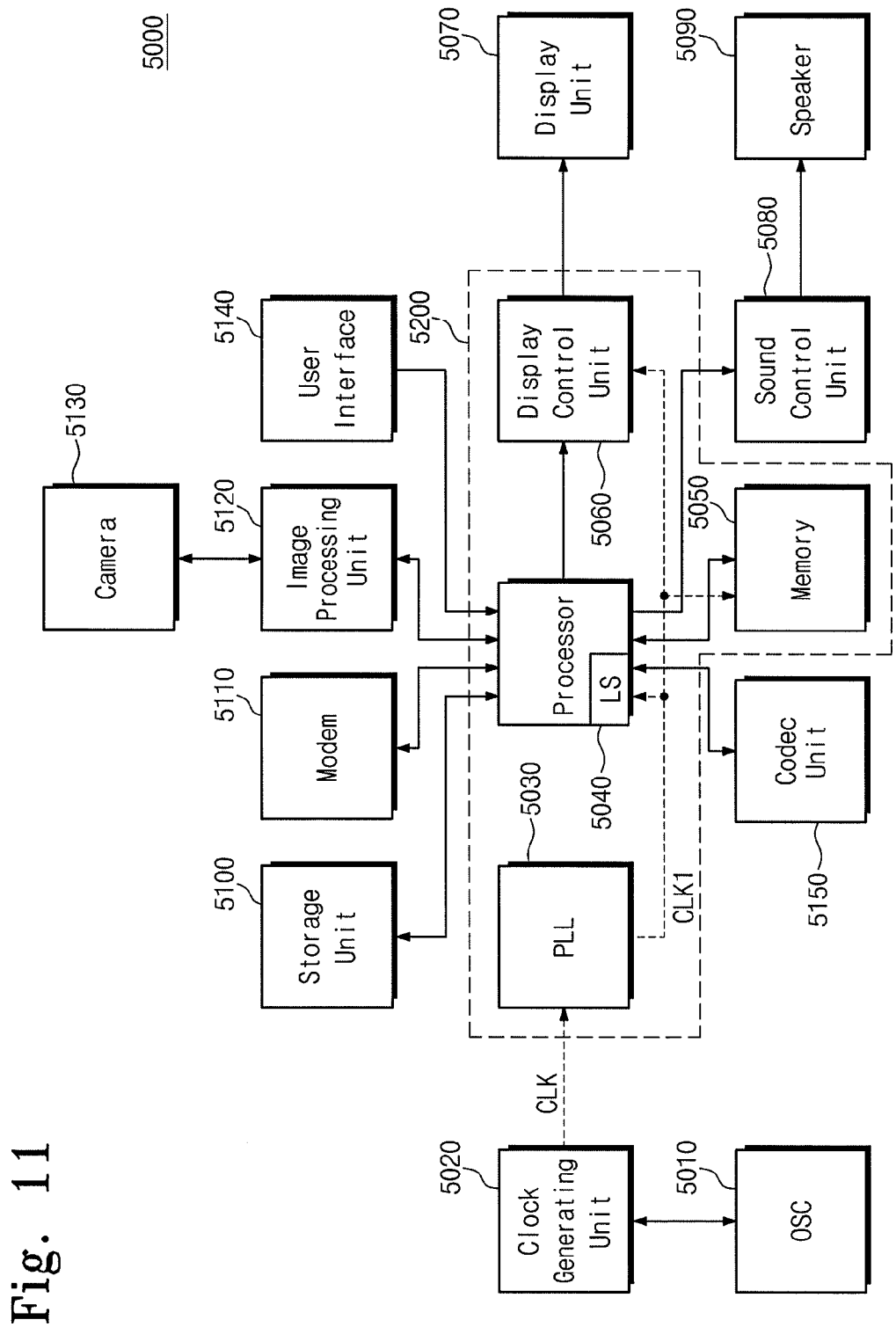
FIG. 11 illustrates a block diagram an exemplary embodiment of a multimedia device including another exemplary embodiment of a level shifter employing one or more features described herein.

FIG. 11 illustrates a block diagram a multimedia device 5000 including an exemplary embodiment of a level shifter LS employing one or more features described herein, e.g., level shifter 100. Referring to FIG. 11, the multimedia device 5000 may include an oscillator 5010, a clock generating unit 5020, a phase locked loop (PLL) 5030, a processor 5040, a memory 5050, a display control unit 5060, a display unit 5070, a sound control unit 5080, a speaker 5090, a storage unit 5100, a modem 5110, an image processing unit 5120, a camera 5130, a user interface 5140, and a codec unit 5150.

In general, only differences between the multimedia device 1000 of FIG. 7 and the multimedia device 5000 of FIG. 11 will be described below. Referring to FIG. 11, in the multimedia device 500, the PLL 5030, the processor 5040, the memory 5050, and the display control unit 5060 may be provided as a system-on-chip 5200.

The clock generating unit 5020 may supply a clock CLK to the system-on-chip 5200, and may supply components necessitating the clock CLK among components of the multimedia device 5000.

The PLL 5030 of the system-on-chip 5200 may generate a first clock CLK1 synchronized with the clock CLK. As described with reference to FIGS. 1 to 5, a level shifter LS of the processor 5050 may maintain duty ratios of high-level and low-level periods identically with respect to input and output clocks, and may generate a second clock CLK based upon the first clock CLK1. The processor 5040 may operate responsive to the second clock CLK2. Other components of the system-on-chip 5200, e.g., the memory 5050 and the display control unit 5060 may operate responsive to the first clock CLK1.

Figure 12:
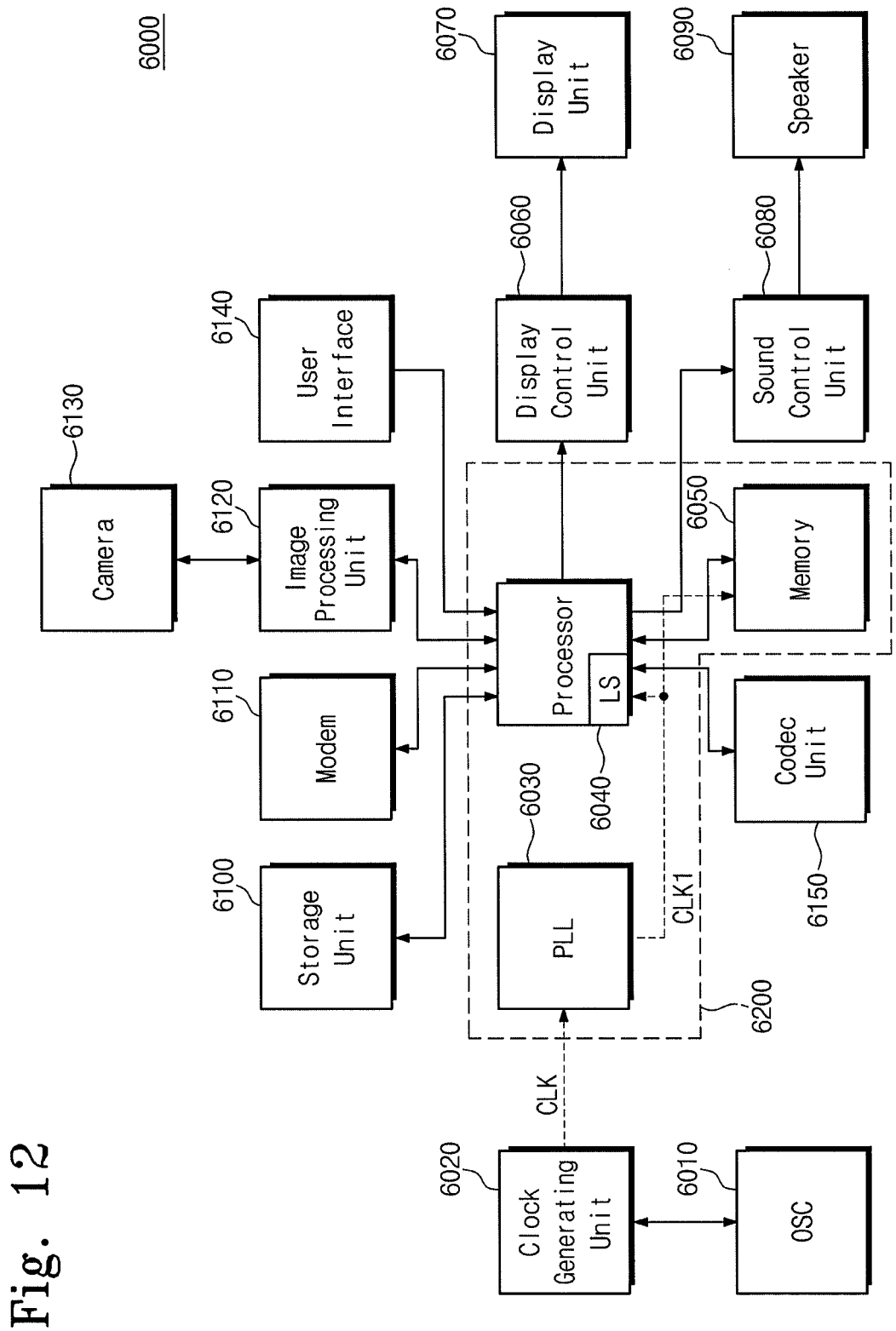
FIG. 12 illustrates a block diagram an exemplary embodiment of a multimedia device including another exemplary embodiment of a level shifter employing one or more features described herein.

FIG. 12 illustrates a block diagram a multimedia device 6000 including an exemplary embodiment of a level shifter LS employing one or more features described herein, e.g., level shifter 100. Referring to FIG. 12, the multimedia device 6000 may include an oscillator 6010, a clock generating unit 6020, a phase locked loop (PLL) 6030, a processor 6040, a memory 6050, a display control unit 6060, a display unit 6070, a sound control unit 6080, a speaker 6090, a storage unit 6100, a modem 6110, an image processing unit 6120, a camera 6130, a user interface 6140, and a codec unit 6150.

In general, only differences between the multimedia device 6000 of FIG. 12 and the multimedia device 1000 of FIG. 7 will be described below. Referring to FIG. 12, in the multimedia device 6000, the PLL 6030, the processor 6040, and the memory 6050 may be provided as a system-on-chip 6200.

The clock generating unit 6020 may supply a clock CLK to the system-on-chip 6200, and may supply components necessitating the clock CLK among components of the multimedia device 6000.

The PLL 6030 of the system-on-chip 6200 may generate a first clock CLK1 synchronized with the clock CLK. As described with reference to FIGS. 1 to 5, a level shifter LS of the processor 6050 may maintain duty ratios of high-level and low-level periods identically with respect to input and output clocks, and may generate a second clock CLK based upon the first clock CLK1. The processor 6040 may operate responsive to the second clock CLK2. Other components of the system-on-chip 6200, for example, the memory 6050 may operate responsive to the first clock CLK1.

Figure 13:
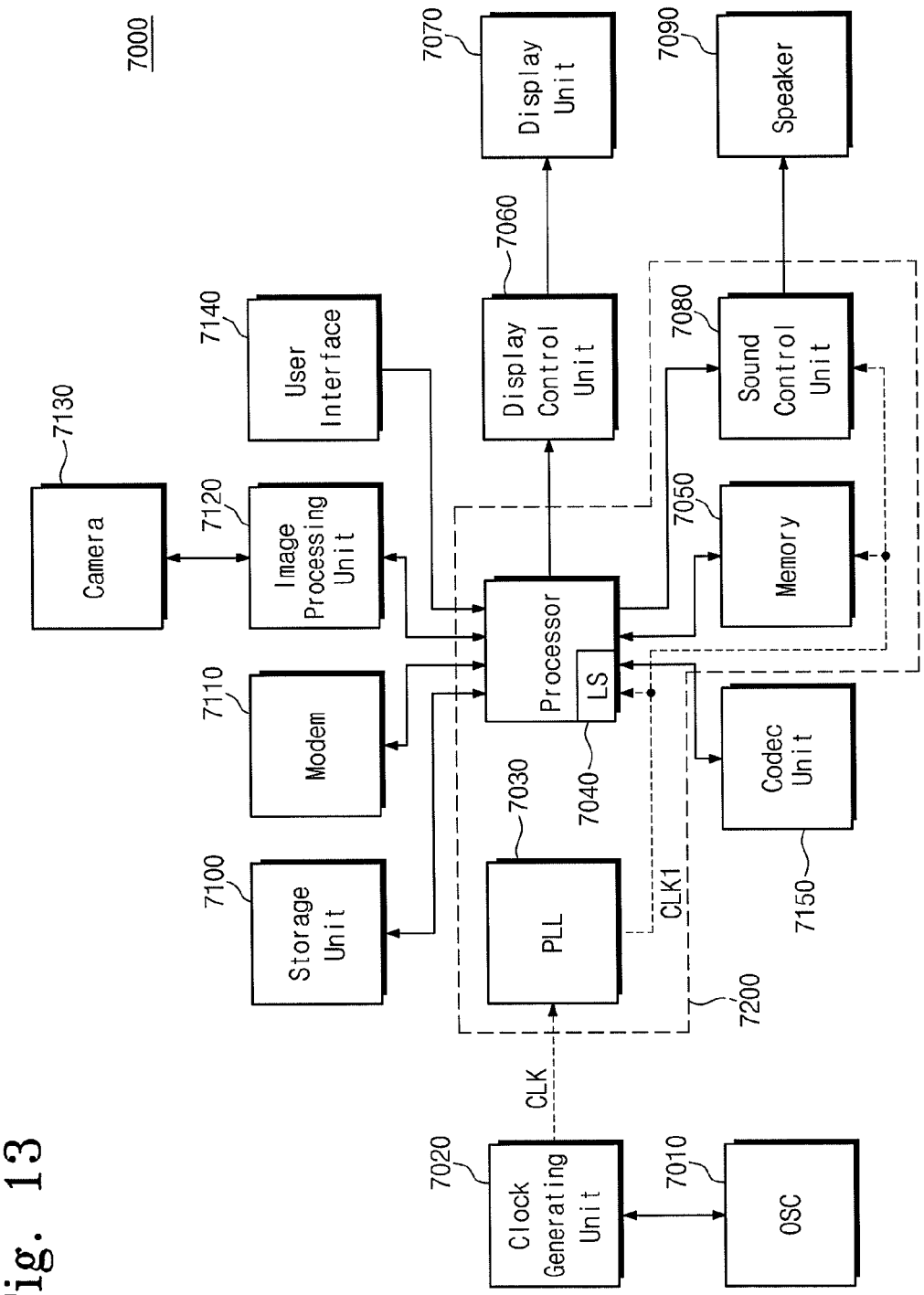
FIG. 13 illustrates a block diagram an exemplary embodiment of a multimedia device including another exemplary embodiment of a level shifter employing one or more features described herein.

FIG. 13 illustrates a block diagram a multimedia device 7000 including an exemplary embodiment of a level shifter LS employing one or more features described herein, e.g., level shifter 100. Referring to FIG. 13, the multimedia device 7000 may include an oscillator 7010, a clock generating unit 7020, a phase locked loop (PLL) 7030, a processor 7040, a memory 7050, a display control unit 7060, a display unit 7070, a sound control unit 7080, a speaker 7090, a storage unit 7100, a modem 7110, an image processing unit 7120, a camera 7130, a user interface 7140, and a codec unit 7150.

In general, only differences between the multimedia device 1000 of FIG. 7 and the multimedia device 7000 of FIG. 13 will be described below. Referring to FIG. 13, in the multimedia device 7000, the PLL 7030, the processor 7040, the memory 7050, and the sound control unit 7080 may be provided as a system-on-chip 7200.

The clock generating unit 7020 may supply a clock CLK to the system-on-chip 7200, and may supply components necessitating the clock CLK among components of the multimedia device 7000.

The PLL 7030 of the system-on-chip 7200 may generate a first clock CLK1 synchronized with the clock CLK. As described with reference to FIGS. 1 to 5, a level shifter LS of the processor 7050 may maintain a duty ratio of high-level and low-level periods, and may generate a second clock CLK based upon the first clock CLK1. The processor 7040 may operate responsive to the second clock CLK2. Other components of the system-on-chip 7200, for example, the memory 7050 and the sound control unit 7080 may operate responsive to the first clock CLK1.

Figure 14:
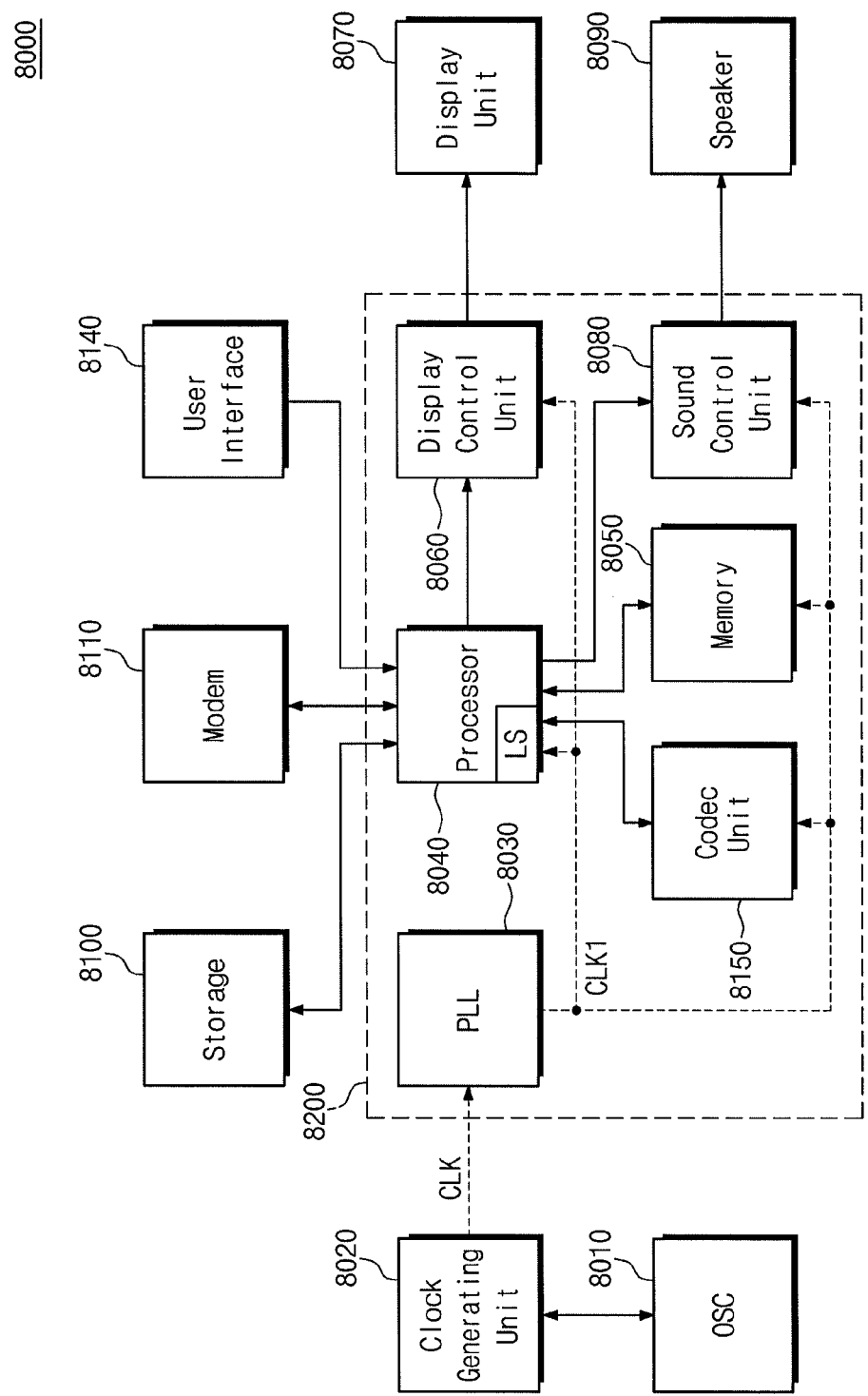
FIG. 14 illustrates a block diagram an exemplary embodiment of a multimedia device including another exemplary embodiment of a level shifter employing one or more features described herein.

FIG. 14 illustrates a block diagram a multimedia device 8000 including an exemplary embodiment of a level shifter LS employing one or more features described herein, e.g., level shifter 100. Referring to FIG. 14, the multimedia device 8000 may include an oscillator 8010, a clock generating unit 8020, a phase locked loop (PLL) 8030, a processor 8040, a memory 8050, a display control unit 8060, a display unit 8070, a sound control unit 8080, a speaker 8090, a storage unit 8100, a modem 8110, a user interface 8140, and a codec unit 8150.

In general, only differences between the multimedia device 1000 of FIG. 7 and the multimedia device 8000 of FIG. 14 will be described below. Referring to FIG. 14, in the multimedia device 8000, the PLL 8030, the processor 8040, the memory 8050, the display control unit 8060, the sound control unit 8080, and the codec unit 8150 may be provided as a system-on-chip 8200. Referring to FIG. 14, an image processing unit and a camera may not be included in the multimedia device 8000.

The clock generating unit 8020 may supply a clock CLK to the system-on-chip 8200, and may supply components necessitating the clock CLK among components of the multimedia device 8000.

The PLL 8030 of the system-on-chip 8200 may generate a first clock CLK1 synchronized with the clock CLK. As described with reference to FIGS. 1 to 5, a level shifter LS of the processor 8050 may maintain duty ratios of high-level and low-level periods identically with respect to input and output clocks, and may generate a second clock CLK based upon the first clock CLK1. The processor 8040 may operate responsive to the second clock CLK2. Other components of the system-on-chip 8200, for example, the memory 8050 and the sound control unit 8080 may operate responsive to the first clock CLK1.

Components included in the system-on-chip 8200 may be changed as described with reference to FIGS. 8 to 13. However, in one or more such embodiments, an image processing unit and a camera may not be provided.

Exemplary embodiments of multimedia devices were described with reference to FIGS. 7 to 14. Multimedia devices, e.g., 1000, 2000, 3000, 4000, 5000, 6000, 7000, 8000, may be applied to various products. Examples of multimedia devices include computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, (e.g., an SSD, a memory card, etc.) one of various electronic devices constituting a computing system, etc.

Figure 15:
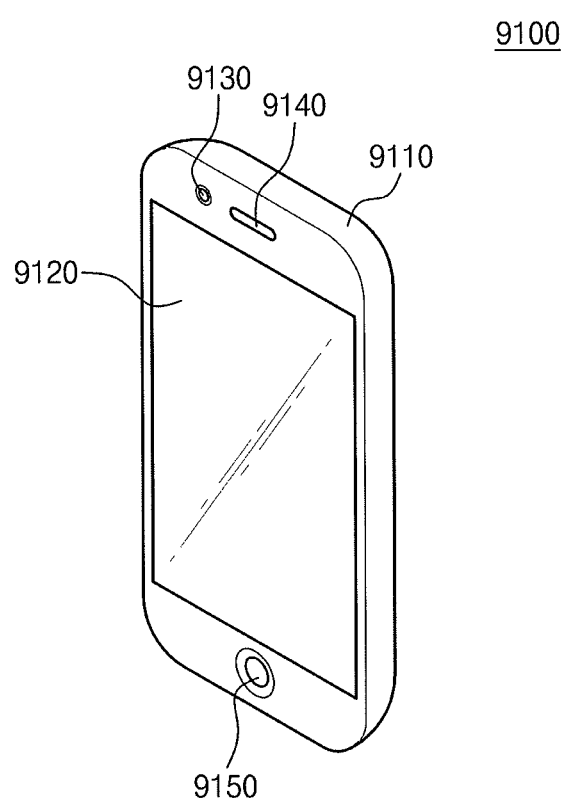
FIG. 15 illustrates a diagram of an exemplary embodiment of a smart phone.

FIG. 15 illustrates a diagram of an exemplary embodiment of a smart phone 9100. Referring to FIG. 15, the smart phone 9100 may include an external case 9110, a screen 9120, a camera 9130, a speaker 9140, and an operating button 9150.

The screen 9120 may correspond to display units 1070 to 8070 described with reference to FIGS. 7 to 14. The camera 9130 may correspond to cameras 1130 to 7130 described with reference to FIGS. 7 to 14. The operating button 9150 may correspond to user interfaces 1140 to 8140 described with reference to FIGS. 7 to 14. If the screen 9120 is formed of a touch screen, the screen 9120 may correspond to the user interfaces 1140 to 8140 described with reference to FIGS. 7 to 14. The speaker 9140 may correspond to speakers 1090 to 8090 described with reference to FIGS. 7 to 14.

An oscillator 1010~8010, a clock generating unit 1020~8020, a phase locked loop 1030~8030, a processor 1040~8040, a memory 1050~8050, a display control unit 1060~8060, a sound control unit 1080~8080, a storage unit 1100~8100, a modem 1110~8110, and a codec unit 1150~8150 may be provided within the external case 9110. An image processing unit 1120~7120 may be further provided within the external case 9110. At least one of the memory 1050~8050, the display control unit 1060~8060, the sound control unit 1080~8080, the storage unit 1100~8100, the modem 1110~8110, the image processing unit 1120~7120, and the codec unit 1150~8150 may form a system-on-chip 1200~8200 together with the phase locked loop 1030~8030 and the processor 1040~8040.

The clock generating unit 1020~8020 may generate a clock CLK in response to an oscillation signal input from the oscillator 1010~8010. The clock CLK may be supplied to the system-on-chip 1200~8200. The phase locked loop 1030~8030 may generate a first clock CLK1 synchronized with the clock CLK. The first clock CLK1 may be supplied to components of the system-on-chip 1200~8200. The processor 1040~8040 may include a level shifter 100 according to an exemplary embodiment of the inventive concept, or may be connected with the level shifter 100. The level shifter 100 may maintain duty ratios of high-level and low-level periods identically with respect to input and output clocks, and may convert the first clock CLK1 of a first voltage domain into a second clock CLK2 of a second voltage domain. The processor 1040~8040 may operate in response to the second clock CLK2. Other components of the system-on-chip 1200~8200 may operate in response to the first clock CLK1.

Although not shown in FIG. 15, the display unit 1070~8070, the speaker 1090~8090, and the user interface 1140~8140 may be provided on at least one of a rear side, an upper side, a lower side, and a lateral side of the smart phone 9100.

Figure 16:
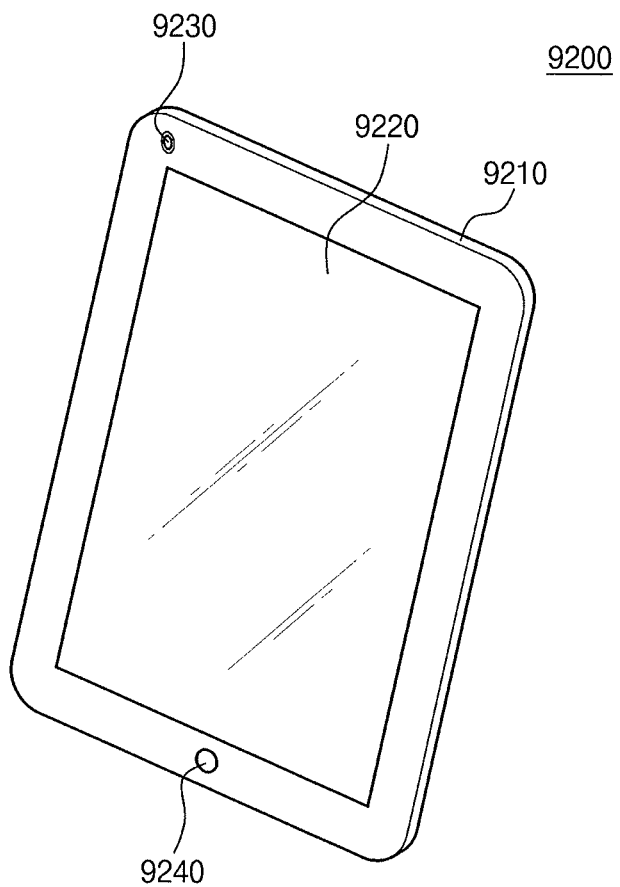
FIG. 16 illustrates a diagram of an exemplary embodiment of a tablet computer.

FIG. 16 illustrates a diagram of an exemplary embodiment of a tablet computer 9200. Referring to FIG. 16, the tablet computer 9200 may include an external case 9210, a screen 9220, a camera 9230, and an operating button 9240.

The screen 9220 may correspond to display units 1070 to 8070 described with reference to FIGS. 7 to 14. The camera 9230 may correspond to cameras 1130 to 7130 described with reference to FIGS. 7 to 13. The operating button 9240 may correspond to user interfaces 1140 to 8140 described with reference to FIGS. 7 to 14. If the screen 9220 is formed of a touch screen, the screen 9220 may correspond to the user interfaces 1140 to 8140. The speaker 9240 may correspond to speakers 1090 to 8090 described with reference to FIGS. 7 to 14.

An oscillator 1010~8010, a clock generating unit 1020~8020, a phase locked loop 1030~8030, a processor 1040~8040, a memory 1050~8050, a display control unit 1060~8060, a sound control unit 1080~8080, a storage unit 1100~8100, a modem 1110~8110, and a codec unit 1150~8150 may be provided within the external case 9210. An image processing unit 1120~7120 may be further provided within the external case 9210. At least one of the memory 1050~8050, the display control unit 1060~8060, the sound control unit 1080~8080, the storage unit 1100~8100, the modem 1110~8110, the image processing unit 1120~7120, and the codec unit 1150~8150 may form a system-on-chip 1200~8200 together with the phase locked loop 1030~8030 and the processor 1040~8040.

The clock generating unit 1020~8020 may generate a clock CLK in response to an oscillation signal input from the oscillator 1010~8010. The clock CLK may be supplied to the system-on-chip 1200~8200. The phase locked loop 1030~8030 may generate a first clock CLK1 synchronized with the clock CLK. The first clock CLK1 may be supplied to components of the system-on-chip 1200~8200. The processor 1040~8040 may include a level shifter 100 according to an exemplary embodiment of the inventive concept, or may be connected with the level shifter 100. The level shifter 100 may identically maintain duty ratios of high-level and low-level periods with respect to input and output clocks, and may convert the first clock CLK1 of a first voltage domain into a second clock CLK2 of a second voltage domain. The processor 1040~8040 may operate in response to the second clock CLK2. Other components of the system-on-chip 1200~8200 may operate in response to the first clock CLK1.

Although not shown in FIG. 16, the display unit 1070~8070, the speaker 1090~8090, and the user interface 1140~8140 may be provided on at least one of a rear side, an upper side, a lower side, and a lateral side of the tablet computer 9200. Further, the display unit 1070~8070, the speaker 1090~8090, and the user interface 1140~8140 may be further provided as accessories connected with the tablet computer 9200.

Figure 17:
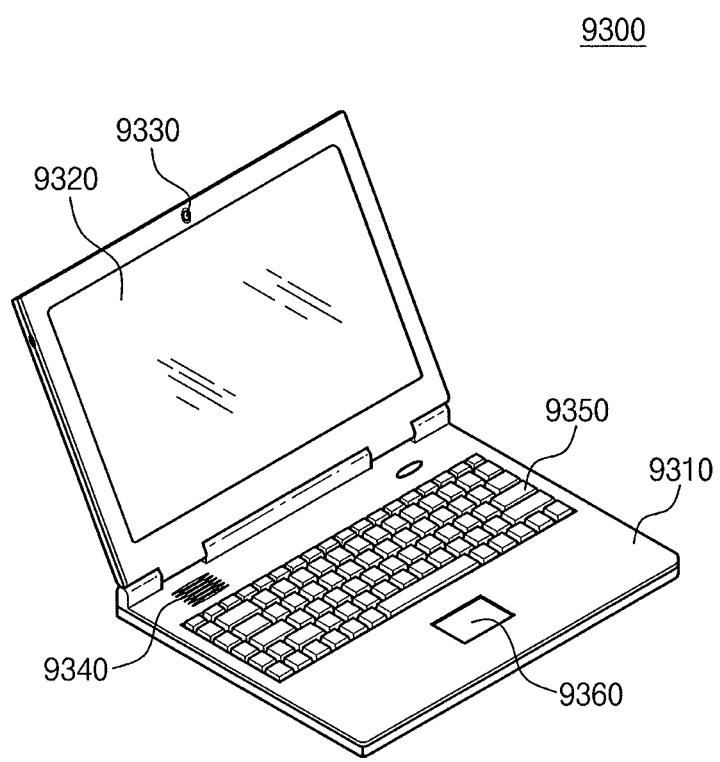
FIG. 17 illustrates a diagram of an exemplary embodiment of a mobile computer.

FIG. 17 illustrates a diagram of an exemplary embodiment of a mobile computer 9300. Referring to FIG. 17, the mobile computer 9300 may include an external case 9310, a screen 9320, a camera 9330, a speaker 9340, a keyboard 9350, and a touch pad 9360.

The screen 9320 may correspond to display units 1070 to 8070 described with reference to FIGS. 7 to 14. The camera 9330 may correspond to cameras 1130 to 7130 described with reference to FIGS. 7 to 13. The keyboard 9350 and the touch pad 9360 may correspond to user interfaces 1140 to 8140 described with reference to FIGS. 7 to 14. If the screen 9320 is formed of a touch screen, the screen 9320 may also correspond to the user interfaces 1140 to 8140. The speaker 9340 may correspond to speakers 1090 to 8090 described with reference to FIGS. 7 to 14.

An oscillator 1010~8010, a clock generating unit 1020~8020, a phase locked loop 1030~8030, a processor 1040~8040, a memory 1050~8050, a display control unit 1060~8060, a sound control unit 1080~8080, a storage unit 1100~8100, a modem 1110~8110, and a codec unit 1150~8150 may be provided within the external case 9310. An image processing unit 1120~7120 may be further provided within the external case 9310. At least one of the memory 1050~8050, the display control unit 1060~8060, the sound control unit 1080~8080, the storage unit 1100~8100, the modem 1110~8110, the image processing unit 1120~7120, and the codec unit 1150~8150 may form a system-on-chip 1200~8200 together with the phase locked loop 1030~8030 and the processor 1040~8040.

The clock generating unit 1020~8020 may generate a clock CLK in response to an oscillation signal input from the oscillator 1010~8010. The clock CLK may be supplied to the system-on-chip 1200~8200. The phase locked loop 1030~8030 may generate a first clock CLK1 synchronized with the clock CLK. The first clock CLK1 may be supplied to components of the system-on-chip 1200~8200. The processor 1040~8040 may include a level shifter 100 according to an exemplary embodiment of the inventive concept, or may be connected with the level shifter 100. The level shifter 100 may maintain duty ratios of high-level and low-level periods identically with respect to input and output clocks, and may convert the first clock CLK1 of a first voltage domain into a second clock CLK2 of a second voltage domain. The processor 1040~8040 may operate in response to the second clock CLK2. Other components of the system-on-chip 1200~8200 may operate in response to the first clock CLK1.

The mobile computer 9300 may be a notebook computer or a netbook. Although not shown in FIG. 17, the display unit 1070~8070, the speaker 1090~8090, and the user interface 1140~8140 may be provided on at least one of a rear side, an upper side, a lower side, and a lateral side of the mobile computer 9300. Further, the display unit 1070~8070, the speaker 1090~8090, and the user interface 1140~8140 may be further provided as accessories connected with the mobile computer 9300.

Figure 18:
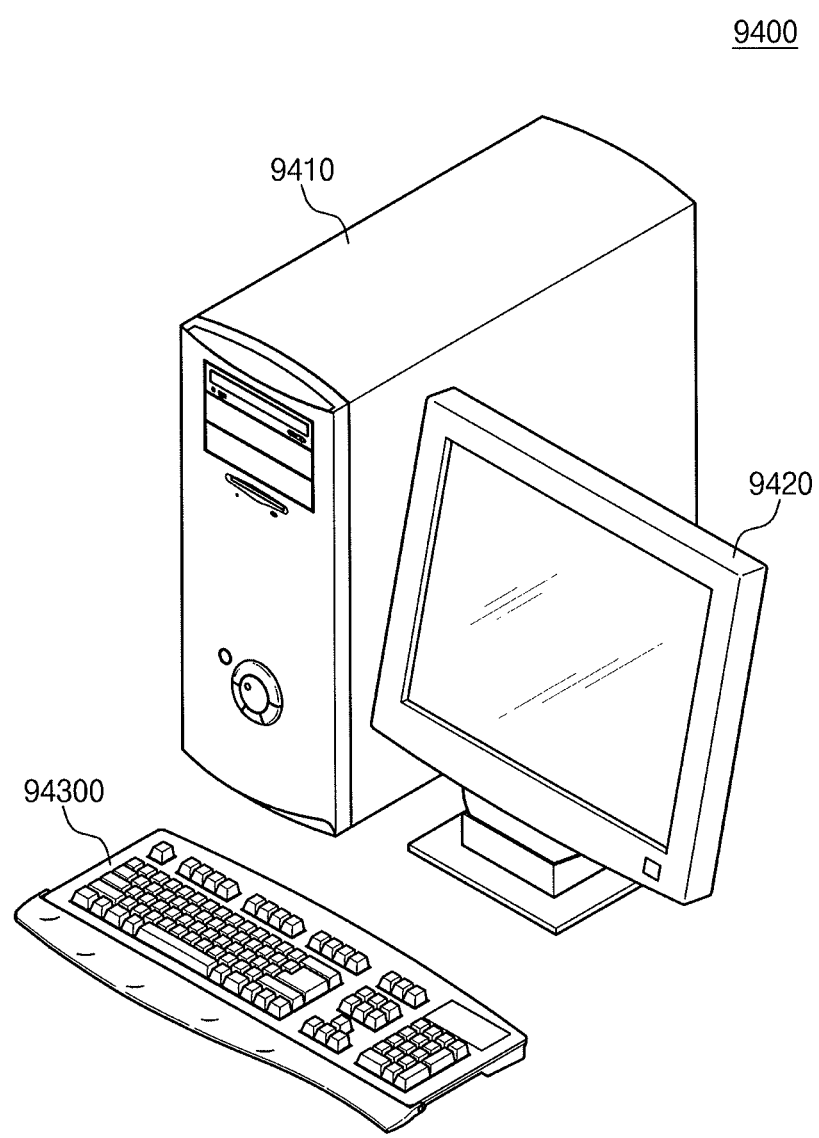
FIG. 18 illustrates a diagram of an exemplary embodiment of a computer.

FIG. 18 illustrates a diagram of an exemplary embodiment of a computer 9400. Referring to FIG. 18, the computer 9400 may include a body 9410, a monitor 9420, and a keyboard 9430.

The monitor 9420 may correspond to display units 1070 to 8070 described with reference to FIGS. 7 to 14. The keyboard 9430 may correspond to user interfaces 1140 to 8140 described with reference to FIGS. 7 to 14. If the monitor 9420 is formed of a touch screen, the monitor 9420 may correspond to the user interfaces 1140 to 8140.

An oscillator 1010~8010, a clock generating unit 1020~8020, a phase locked loop 1030~8030, a processor 1040~8040, a memory 1050~8050, a display control unit 1060~8060, a sound control unit 1080~8080, a storage unit 1100~8100, a modem 1110~8110, and a codec unit 1150~8150 may be provided within the body 9410. An image processing unit 1120~7120 may be further provided within the body 9410. At least one of the memory 1050~8050, the display control unit 1060~8060, the sound control unit 1080~8080, the storage unit 1100~8100, the modem 1110~8110, the image processing unit 1120~7120, and the codec unit 1150~8150 may form a system-on-chip 1200~8200 together with the phase locked loop 1030~8030 and the processor 1040~8040.

The clock generating unit 1020~8020 may generate a clock CLK in response to an oscillation signal input from the oscillator 1010~8010. The clock CLK may be supplied to the system-on-chip 1200~8200. The phase locked loop 1030~8030 may generate a first clock CLK1 synchronized with the clock CLK. The first clock CLK1 may be supplied to components of the system-on-chip 1200~8200. The processor 1040~8040 may include a level shifter 100 according to an exemplary embodiment of the inventive concept, or may be connected with the level shifter 100. The level shifter 100 may maintain duty ratios of high-level and low-level periods identically with respect to input and output clocks, and may convert the first clock CLK1 of a first voltage domain into a second clock CLK2 of a second voltage domain. The processor 1040~8040 may operate in response to the second clock CLK2. Other components of the system-on-chip 1200~8200 may operate in response to the first clock CLK1.

Although not shown in FIG. 18, the display unit 1070~8070, the speaker 1090~8090, and the user interface 1140~8140 may be provided on at least one of a rear side, an upper side, a lower side, and a lateral side of the computer 9400. Further, the display unit 1070~8070, the speaker 1090~8090, and the user interface 1140~8140 may be further provided as accessories connected with the computer 9400.

Figure 19:
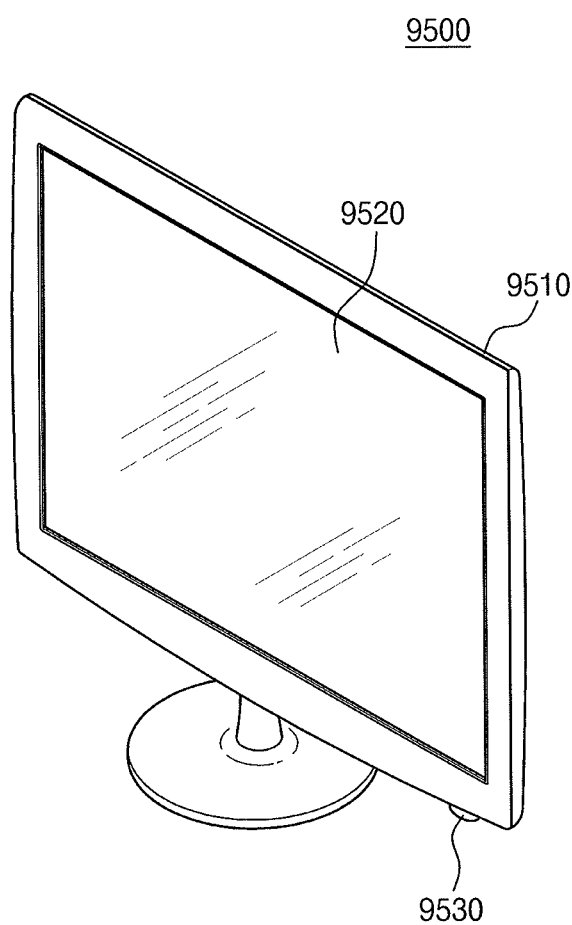
FIG. 19 illustrates a diagram of an exemplary embodiment of a television.

FIG. 19 illustrates a diagram of an exemplary embodiment of a television 9500. Referring to FIG. 19, the television 9500 may include an external case 9510, a screen 9520, and an operating button 9530.

The screen 9520 may correspond to display units 1070 to 8070 described with reference to FIGS. 7 to 14. The operating button 9530 may correspond to user interfaces 1140 to 8140 described with reference to FIGS. 7 to 14. If the screen 9520 is formed of a touch screen, the screen 9520 may correspond to the user interfaces 1140 to 8140.

An oscillator 1010~8010, a clock generating unit 1020~8020, a phase locked loop 1030~8030, a processor 1040~8040, a memory 1050~8050, a display control unit 1060~8060, a sound control unit 1080~8080, a storage unit 1100~8100, a modem 1110~8110, and a codec unit 1150~8150 may be provided within the external case 9510. An image processing unit 1120~7120 may be further provided within the external case 9510. At least one of the memory 1050~8050, the display control unit 1060~8060, the sound control unit 1080~8080, the storage unit 1100~8100, the modem 1110~8110, the image processing unit 1120~7120, and the codec unit 1150~8150 may form a system-on-chip 1200~8200 together with the phase locked loop 1030~8030 and the processor 1040~8040.

The clock generating unit 1020~8020 may generate a clock CLK in response to an oscillation signal input from the oscillator 1010~8010. The clock CLK may be supplied to the system-on-chip 1200~8200. The phase locked loop 1030~8030 may generate a first clock CLK1 synchronized with the clock CLK. The first clock CLK1 may be supplied to components of the system-on-chip 1200~8200. The processor 1040~8040 may include a level shifter 100 according to an exemplary embodiment of the inventive concept, or may be connected with the level shifter 100. The level shifter 100 may maintain duty ratios of high-level and low-level periods identically with respect to input and output clocks, and may convert the first clock CLK1 of a first voltage domain into a second clock CLK2 of a second voltage domain. The processor 1040~8040 may operate in response to the second clock CLK2. Other components of the system-on-chip 1200~8200 may operate in response to the first clock CLK1.

The television may be a three-dimensional (3D) television or a smart television. Although not shown in FIG. 19, the display unit 1070~8070, the speaker 1090~8090, and the user interface 1140~8140 may be further provided on at least one of a rear side, an upper side, a lower side, and a lateral side of the television 9500. Further, the display unit 1070~8070, the speaker 1090~8090, and the user interface 1140~8140 may be provided as accessories connected with the television 9500. Exemplarily, a remote controller communicating with the television 9500 may be further provided as the user interface 1140~8140.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or a layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A level shifter, comprising:
    an input node;
    a voltage shifter connected between the input node and configured to generate an output clock of a second voltage domain in response to an input clock of a first voltage domain input via the input node; and
    an output node connected to the shifter and configured to output the output clock,
    wherein the voltage shifter includes a first voltage shifter circuit and a second voltage shifter circuit having a same structure and connected in parallel between the input node and the output node, wherein the first voltage shifter circuit includes at least two inverters operating at the second voltage domain, the at least two inverters directly connected in series between the input node and the output node, and wherein the second voltage shifter circuit includes at least one first inverter operating at the first voltage domain and at least one second inverter operating at the second voltage domain, wherein the at least one first inverter and the at least one second inverter are directly connected in series between the input node and the output node.

2. The level shifter as claimed in claim 1, wherein the at least one second inverter operating at the second voltage domain is configured to directly receive an output of the at least one first inverter operating at the first voltage domain.

3. A level shifter, comprising:
    an input node;
    a voltage shifter connected between the input node and configured to generate an output clock of a second voltage domain in response to an input clock of a first voltage domain input via the input node; and
    an output node connected to the shifter and configured to output the output clock, wherein the voltage shifter includes a first voltage shifter circuit and a second voltage shifter circuit having a same structure and connected in parallel between the input node and the output node, wherein:
    the first voltage shifter circuit includes a first inverter configured to output a second voltage or a ground voltage according to a voltage of the input node, and a second inverter configured to output the second voltage or the ground voltage to the output node according to an output of the first inverter, and
    the second voltage shifter circuit includes a third inverter configured to output the first voltage or the ground voltage according to a voltage of the input node, and a fourth inverter configured to output the second voltage or the ground voltage to the output node according to an output of the third inverter.

4. The level shifter as claimed in claim 3, wherein the first to fourth inverters are CMOS inverters.

5. A system-on-chip, comprising:
    a phase locked loop configured to generate a first clock of a first voltage domain;
    a peripheral block, an audio block, a display block, a graphic block, an image processing block, and a codec block operating in response to the first clock;
    a level shifter configured to generate a second clock of a second voltage domain based upon the first clock; and
    a processor operating in response to the second clock, wherein the level shifter includes first and second voltage shifter circuits that are configured to have a same structure and are connected in parallel between an input node and an output node,
    wherein the first voltage shifter circuit includes at least two inverters which operates at the second voltage domain and are directly connected in series between the input node and the output node,
    wherein the second voltage shifter circuit includes at least one first inverter operating at the first voltage domain and at least one second inverter operating at the second voltage domain,
    wherein the at least one first inverter and the at least one second inverter are directly connected in series between the input node and the output node.

6. The system-on-chip as claimed in claim 5, wherein the first voltage shifter circuit comprises a first inverter and a second inverter connected in series and configured to operate at the second voltage domain, and wherein the second voltage shifter circuit includes a third inverter configured to operate at the first voltage domain, and a fourth inverter configured to operate at the second voltage domain.

7. The system-on-chip as claimed in claim 5, wherein a voltage of the second voltage domain is higher in level than that of the first voltage domain.

8. A multimedia device, comprising:
    a processor;
    a working memory of the processor;
    a modem configured to communicate with an exterior according to a control of the processor;
    a storage unit configured to store data according to a control of the processor;
    an user interface configured to sense an external signal and to transfer the sensed signal to the processor;
    a display control unit configured to display an image via a display unit according to a control of the processor;
    a sound control unit configured to output a sound via a speaker according to a control of the processor;
    a codec unit configured to perform encoding and decoding operations according to a control of the processor;
    a clock generating unit configured to generate a clock according to an output of an oscillator;
    a phase locked loop configured to generate a first clock of a first voltage domain synchronized with the clock; and
    a level shifter configured to generate a second clock of a second voltage domain in response to the first clock, wherein the processor operates in response to the second clock, and wherein the level shifter includes:
- a first inverter operating at the second voltage domain and having a first input connected to the input node;
- a second inverter operating at the second voltage domain, having a second input connected to a first output of the first inverter, and having a second output connected to the output node;
- a third inverter operating at the first voltage domain and having a third input connected to the input node; and
- a fourth inverter operating at the second voltage domain, having a fourth input connected to a third output of the third inverter, and having a fourth output connected to the output node.

9. The multimedia device as claimed in claim 8, wherein the processor, the working memory, the display control unit, the sound control unit, the codec unit, and the phase locked loop constitute a system-on-chip, and wherein the working memory, the display control unit, the sound control unit, and the codec unit operate in response to the first clock.

10. The multimedia device as claimed in claim 8, further comprising:
- an image processing unit configured to process image data taken via a camera according to a control of the processor.

11. The multimedia device as claimed in claim 10, wherein the processor, the display control unit, the sound control unit, the image processing unit, the working memory, the codec unit, and the phase locked loop constitute a system-on-chip, and wherein the working memory, the display control unit, the sound control unit, the image processing unit, and the codec unit operate in response to the first clock.

12. The multimedia device as claimed in claim 10, wherein the processor, the display control unit, the sound control unit, the modem, the image processing unit, the working memory, the codec unit, and the phase locked loop are included together as a system-on-chip, and wherein the display control unit, the sound control unit, the modem, the image processing unit, the working memory, and the codec unit operate in response to the first clock.

13. The multimedia device as claimed in claim 10, wherein the processor, the display control unit, the sound control unit, the working memory, the codec unit, and the phase locked loop are included together as a system-on-chip, and wherein the display control unit, the sound control unit, the working memory, and the codec unit operate in response to the first clock.

14. The multimedia device as claimed in claim 10, wherein the processor, the display control unit, the sound control unit, the working memory, and the phase locked loop are included together as a system-on-chip, and wherein the display control unit, the sound control unit, and the working memory operate in response to the first clock.

15. The multimedia device as claimed in claim 10, wherein the processor, the display control unit, the working memory, and the phase locked loop are included together as a system-on-chip, and wherein the display control unit and the working memory operate in response to the first clock.

16. The multimedia device as claimed in claim 10, wherein:
- the processor, the working memory, and the phase locked loop are included together as a system-on-chip, and
- the working memory operates in response to the first clock.

17. The multimedia device as claimed in claim 10, wherein the processor, the sound control unit, the working memory, and the phase locked loop are included as a system-on-chip, and wherein the sound control unit and the working memory operate in response to the first clock.

18. The multimedia device as claimed in claim 10, wherein the processor, the working memory, modem, the storage unit, the user interface, the display control unit, the display unit, the sound control unit, the speaker, the oscillator, the clock generating unit, the camera, an image processing unit, the codec unit, and the phase locked loop are included in a mobile device.

19. The multimedia device as claimed in claim 10, wherein the processor, the working memory, modem, the storage unit, the user interface, the display control unit, the display unit, the sound control unit, the speaker, the oscillator, the clock generating unit, the camera, an image processing unit, the codec unit, and the phase locked loop are included in a smart television.

20. A level shifter, comprising:
- a first inverter operating at a second voltage domain and having a first input connected to an input node;
- a second inverter operating at the second voltage domain, having a second input connected to a first output of the first inverter, and having a second output connected to an output node;
- a third inverter operating at the first voltage domain and having a third input connected to the input node; and
- a fourth inverter operating at the second voltage domain, having a fourth input connected to a third output of the third inverter, and having a fourth output connected to the output node, wherein an input signal belong to the first voltage domain is input to the input node, and wherein an output signal belong to the second voltage domain is output from the output node.

* * * * *